United States Patent
Ishizu et al.

(10) Patent No.: US 10,950,297 B2
(45) Date of Patent: *Mar. 16, 2021

(54) SEMICONDUCTOR DEVICE, ELECTRONIC COMPONENT, AND ELECTRONIC DEVICE

(71) Applicant: Semiconductor Energy Laboratory Co., Ltd., Atsugi (JP)

(72) Inventors: Takahiko Ishizu, Kanagawa (JP); Hikaru Tamura, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/572,784

(22) Filed: Sep. 17, 2019

(65) Prior Publication Data
US 2020/0013453 A1 Jan. 9, 2020

Related U.S. Application Data

(63) Continuation of application No. 16/109,851, filed on Aug. 23, 2018, now Pat. No. 10,490,266, which is a
(Continued)

(30) Foreign Application Priority Data

Jan. 29, 2016 (JP) .............................. JP2016-016658
Jan. 29, 2016 (JP) .............................. JP2016-016660

(51) Int. Cl.
*G11C 5/06* (2006.01)
*G11C 11/419* (2006.01)
(Continued)

(52) U.S. Cl.
CPC .......... *G11C 11/419* (2013.01); *G11C 11/401* (2013.01); *G11C 11/4076* (2013.01);
(Continued)

(58) Field of Classification Search
CPC ....... G11C 5/025; G11C 7/18; G11C 11/4097; G11C 11/419; G11C 11/4076; G11C 11/409; H01L 27/1225; H01L 27/1255
(Continued)

(56) References Cited

U.S. PATENT DOCUMENTS 5,926,434 A 7/1999 Mori
6,314,017 B1 11/2001 Emori et al.
(Continued)

FOREIGN PATENT DOCUMENTS

EP 1235228 A 8/2002
JP 62-195863 U 12/1987
(Continued)

OTHER PUBLICATIONS

Yakubo.Y et al., "High-speed and Low-leakage Characteristics of 60-nm C-axis Aligned Crystalline Oxide Semiconductor FET with GHz-ordered Cutoff Frequency", SSDM 2014 (Extended Abstracts of the 2014 International Conference on Solid State Devices and Materials), Sep. 8, 2014, pp. 648-649.
(Continued)

*Primary Examiner* — Hoai V Ho
*Assistant Examiner* — Minh Dinh
(74) *Attorney, Agent, or Firm* — Fish & Richardson P.C.

(57) ABSTRACT

A memory in which a write cycle time is longer than time for one clock cycle can be mounted on a processor. The processor includes a processor core, a bus, and a memory section. The memory section includes a first memory. A cell array of the first memory is composed of gain cells. The processor core is configured to generate a write enable signal. The first memory is configured to generate a wait signal on the basis of the write enable signal. The processor core is configured to delay access to the memory section by
(Continued)

time for n clock cycles, on the basis of the wait signal. (n+1) clock cycles can be assigned to a write cycle of the first memory.

7 Claims, 26 Drawing Sheets

Related U.S. Application Data continuation of application No. 15/415,456, filed on Jan. 25, 2017, now Pat. No. 10,068,640.

(51) Int. Cl.
| | | |
|---|---|---|
| G11C 11/401 | (2006.01) | |
| G11C 11/4076 | (2006.01) | |
| G11C 11/4096 | (2006.01) | |
| H01L 27/12 | (2006.01) | |
| H01L 23/544 | (2006.01) | |
| H01L 27/105 | (2006.01) | |
| H01L 29/786 | (2006.01) | |
| G11C 11/405 | (2006.01) | |

(52) U.S. Cl.
CPC ........ *G11C 11/4096* (2013.01); *H01L 23/544* (2013.01); *H01L 27/1052* (2013.01); *H01L 27/1225* (2013.01); *H01L 27/1255* (2013.01); *H01L 29/7869* (2013.01); *G11C 11/405* (2013.01); *G11C 2207/229* (2013.01)

(58) Field of Classification Search
USPC .......................................................... 365/72
See application file for complete search history.

(56) References Cited

U.S. PATENT DOCUMENTS

| | | | |
|---|---|---|---|
| 6,751,144 B2 | 6/2004 | Takahashi et al. | |
| 7,127,626 B2 | 10/2006 | Inaba | |
| 9,406,370 B2* | 8/2016 | Ishizu | G11C 11/406 |
| 10,068,640 B2* | 9/2018 | Ishizu | G11C 11/401 |
| 2004/0139362 A1 | 7/2004 | Inaba | |
| 2005/0108662 A1 | 5/2005 | Morfey et al. | |
| 2005/0280000 A1 | 12/2005 | Ishii et al. | |
| 2006/0023508 A1* | 2/2006 | Sugimoto | G11C 16/06 365/185.08 |
| 2006/0085711 A1* | 4/2006 | Aoki | G11C 29/12015 714/731 |
| 2007/0002651 A1 | 1/2007 | Lee | |
| 2007/0106836 A1* | 5/2007 | Lee | G06F 13/385 711/103 |
| 2007/0280028 A1 | 12/2007 | Kurokawa | |
| 2008/0013385 A1 | 1/2008 | Miyatake | |
| 2011/0101339 A1 | 5/2011 | Yamazaki et al. | |
| 2011/0255325 A1 | 10/2011 | Nagatsuka et al. | |
| 2012/0037972 A1 | 2/2012 | Yoneda | |
| 2013/0003441 A1 | 1/2013 | Takemura | |
| 2013/0100730 A1* | 4/2013 | Chang | G11C 11/418 365/154 |
| 2014/0269099 A1 | 9/2014 | Nagatsuka et al. | |
| 2015/0263007 A1 | 9/2015 | Yamazaki et al. | |
| 2015/0310906 A1 | 10/2015 | Matsuzaki et al. | |
| 2015/0348610 A1 | 12/2015 | Ishizu | |
| 2016/0172009 A1 | 6/2016 | Matsuzaki et al. | |
| 2016/0172010 A1 | 6/2016 | Kato | |
| 2016/0211266 A1 | 7/2016 | Kurokawa | |
| 2016/0217830 A1 | 7/2016 | Tsubuku et al. | |
| 2016/0293232 A1 | 10/2016 | Ishizu et al. | |
| 2017/0221547 A1 | 8/2017 | Ishizu et al. | |
| 2017/0221899 A1 | 8/2017 | Uesugi et al. | |
| 2017/0337149 A1 | 11/2017 | Onuki et al. | |
| 2018/0366185 A1* | 12/2018 | Ishizu | G11C 11/401 |

FOREIGN PATENT DOCUMENTS

| | | |
|---|---|---|
| JP | 04-082735 A | 7/1992 |
| JP | 2001-093988 A | 4/2001 |
| JP | 2004-054766 A | 2/2004 |
| JP | 2006-012878 A | 1/2006 |
| JP | 2011-119675 A | 6/2011 |
| JP | 2016-006708 A | 1/2016 |
| TW | 368653 | 9/1999 |
| TW | 535161 | 6/2003 |

OTHER PUBLICATIONS

Matsuzaki.T et al., "A 128kb 4b/cell Nonvolatile Memory with Crystalline In—Ga—Zn Oxide FET Using Vt Cancel Write Method", ISSCC 2015 (Digest of Technical Papers. IEEE International Solid-State Circuits Conference), Feb. 22, 2015, pp. 306-308.

International Search Report (Application No. PCT/IB2017/050272) dated Apr. 11, 2017.

Written Opinion (Application No. PCT/IB2017/050272) dated Apr. 11, 2017.

Taiwanese Office Action (Application No. 106103281) dated Aug. 17, 2020.

* cited by examiner

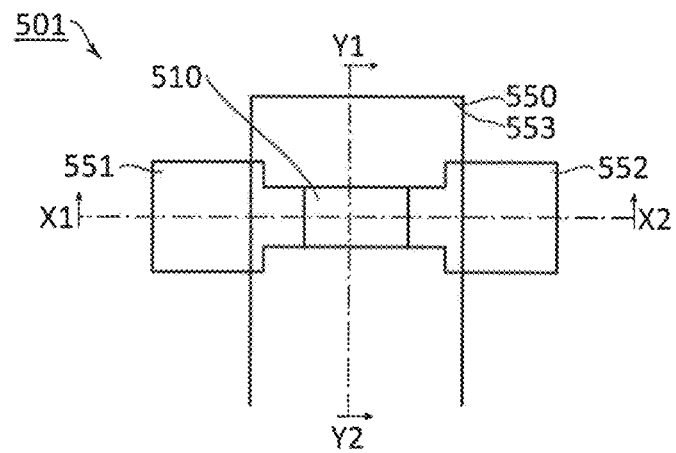
FIG. 17A
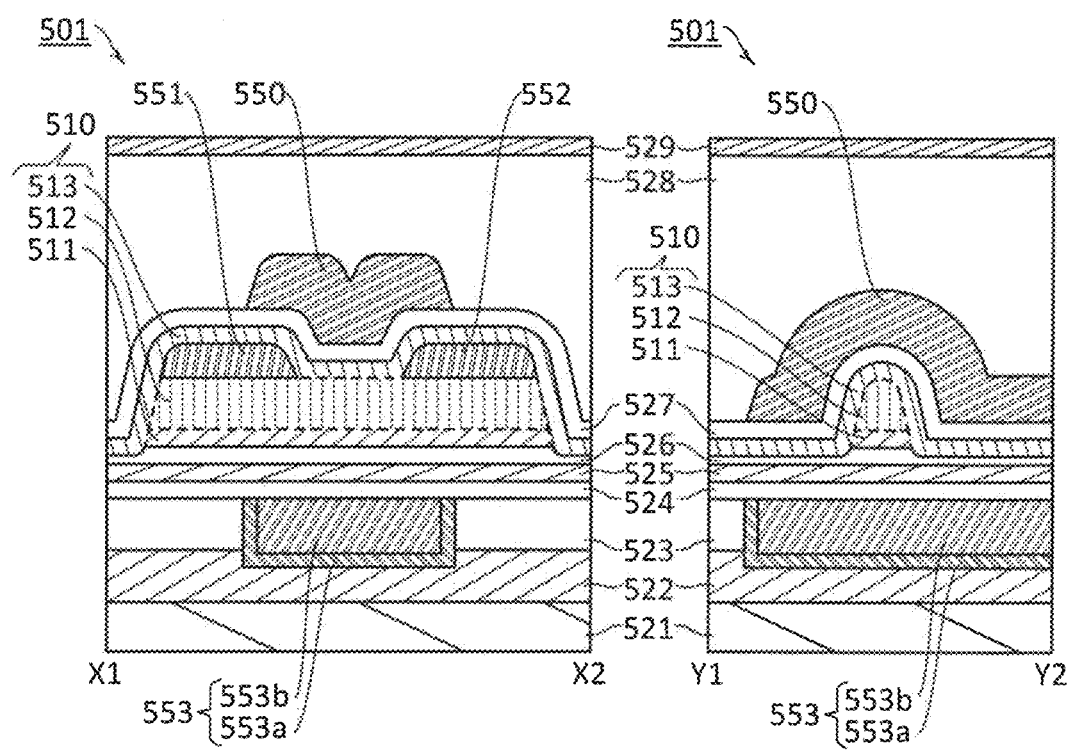
FIG. 17B
FIG. 17C

FIG. 18A
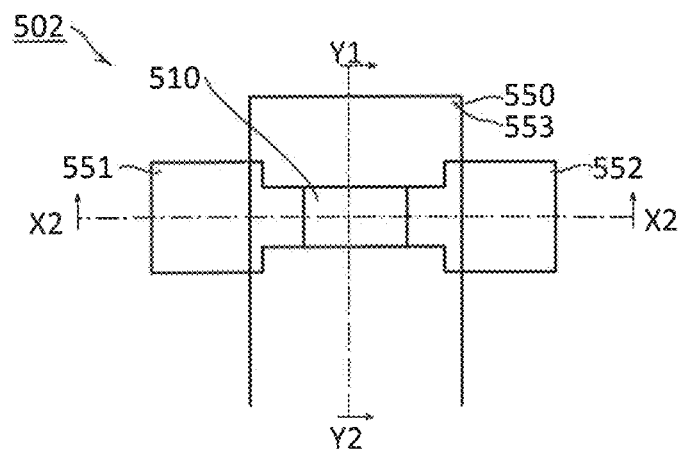
FIG. 18B
FIG. 18C
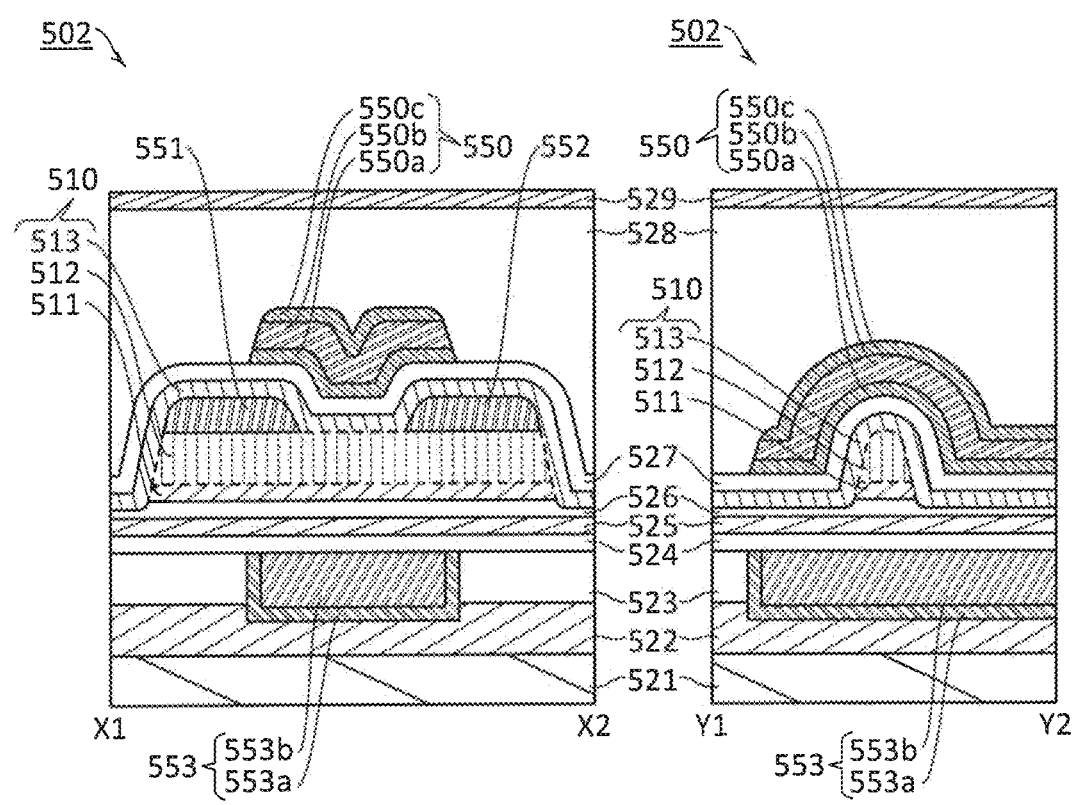

FIG. 19A
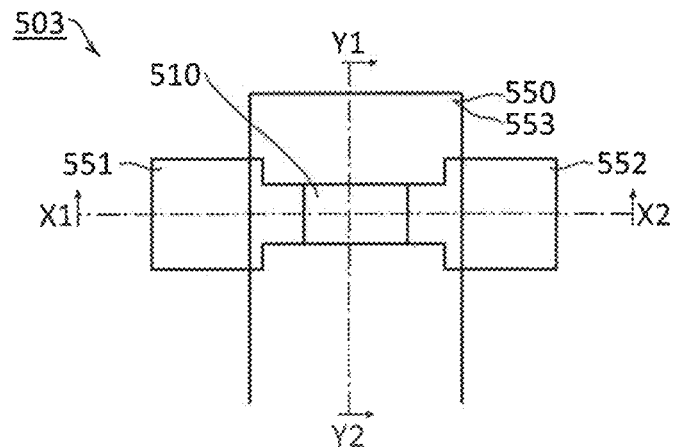
FIG. 19B
FIG. 19C
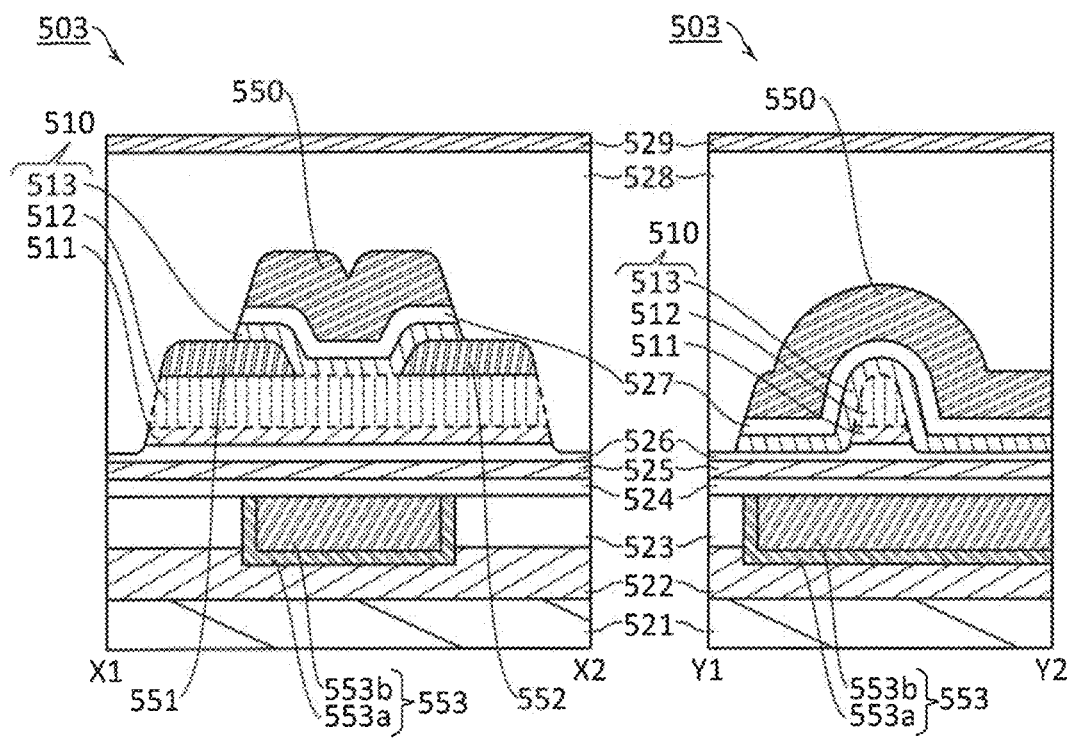

FIG. 21A
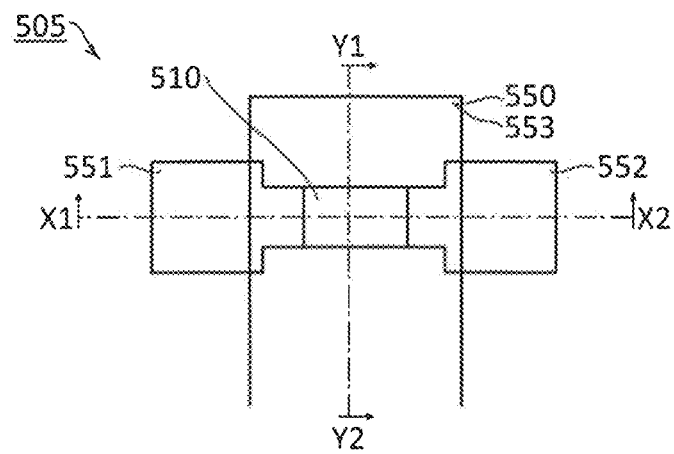
FIG. 21B
FIG. 21C
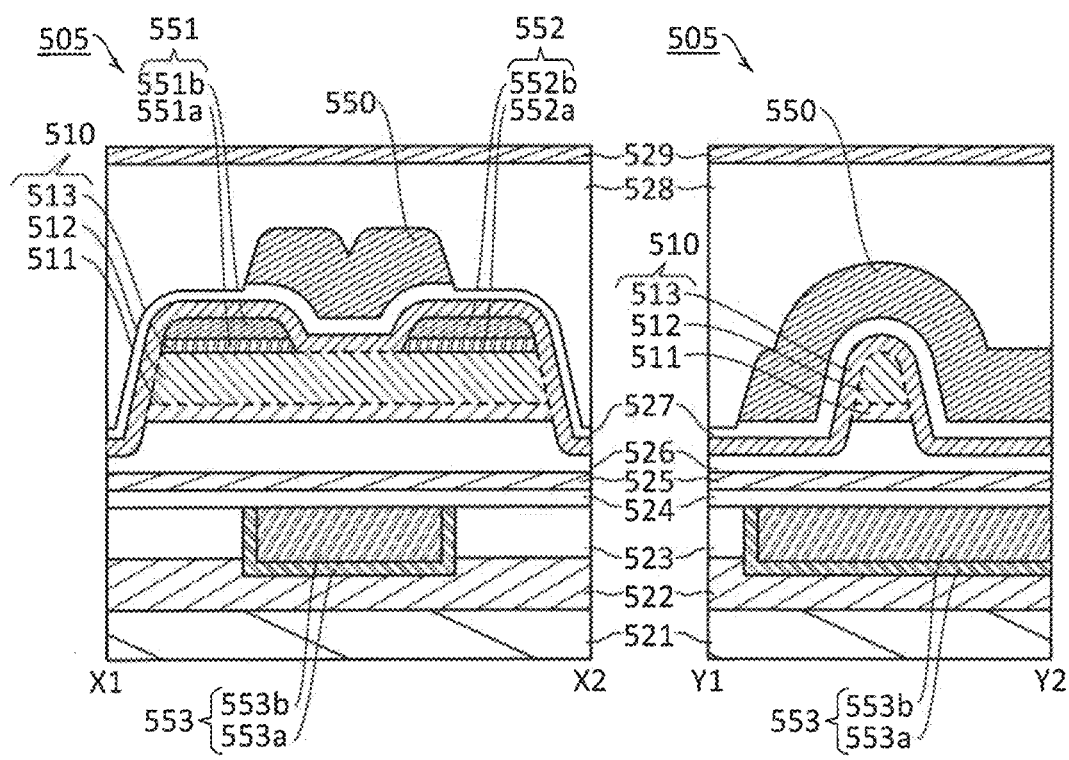

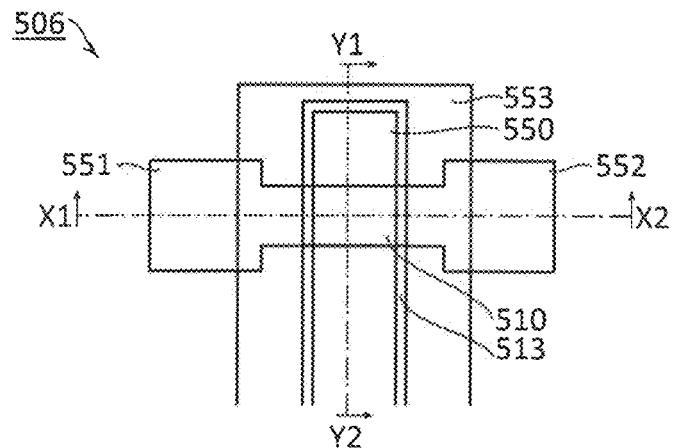
FIG. 22A
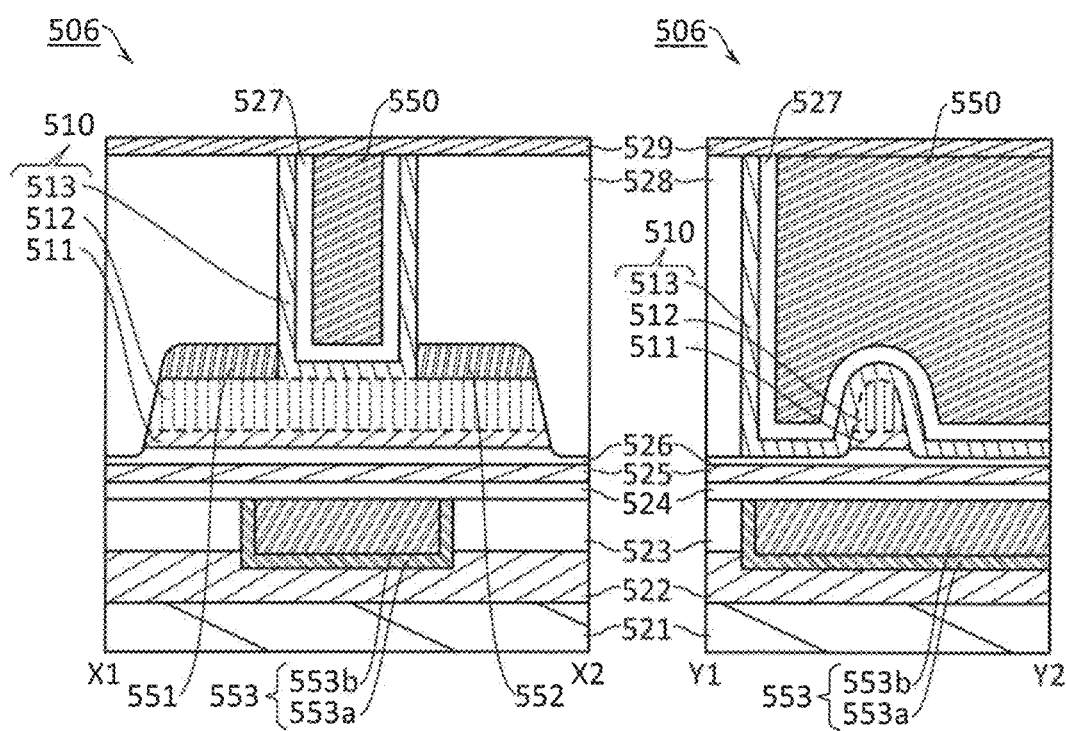
FIG. 22B
FIG. 22C

FIG. 23A
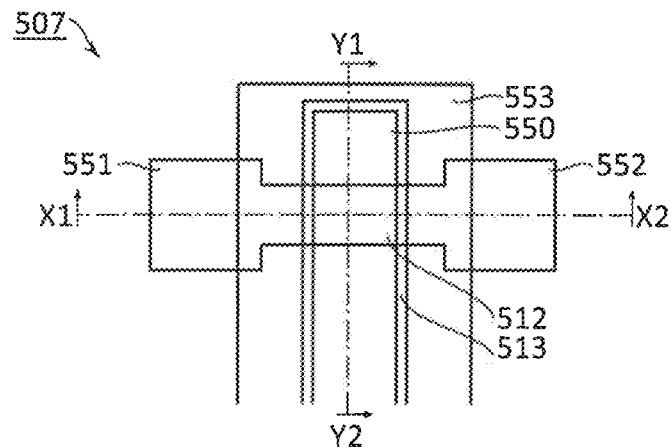
FIG. 23B
FIG. 23C
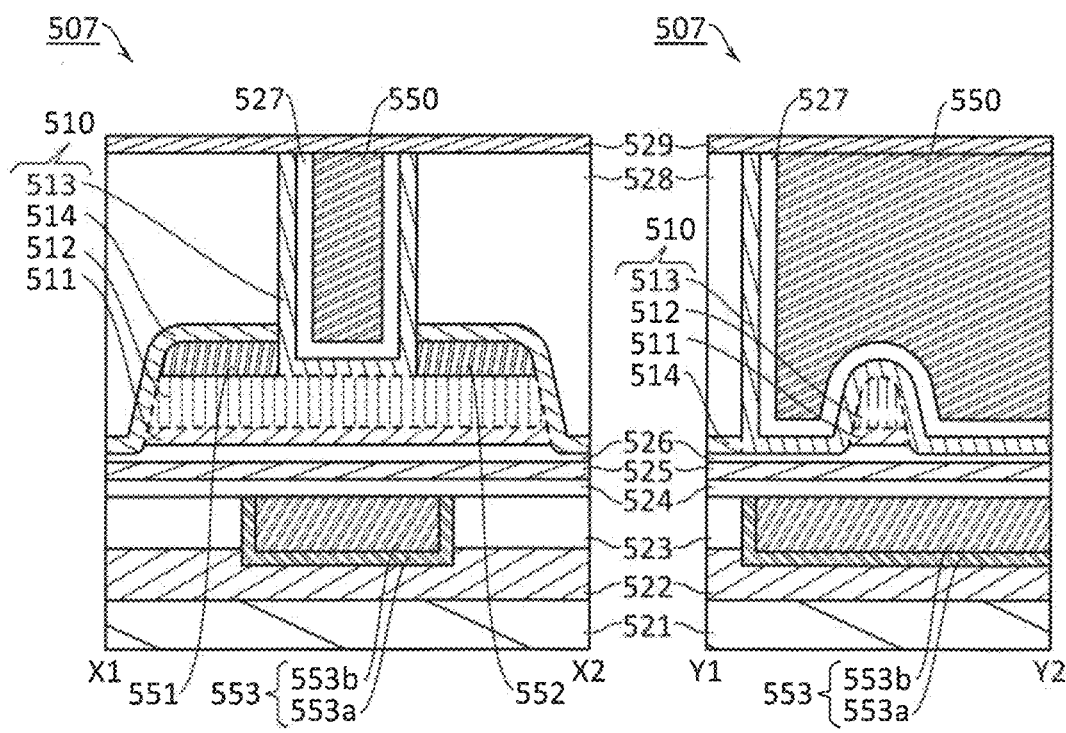

metal oxide layer
conductive layer
insulating layer

SEMICONDUCTOR DEVICE, ELECTRONIC COMPONENT, AND ELECTRONIC DEVICE

CROSS-REFERENCE TO RELATED APPLICATIONS

This application is a continuation of U.S. application Ser. No. 16/109,851, filed Aug. 23, 2018, now allowed, which is a continuation of U.S. application Ser. No. 15/415,456, filed Jan. 25, 2017, now U.S. Pat. No. 10,068,640, which claims the benefit of foreign priority applications filed in Japan on Jan. 29, 2016, as Serial Nos. 2016-016658 and 2016-016660, all of which are incorporated by reference.

TECHNICAL FIELD

One embodiment of the present invention disclosed in the specification, the drawings, and the claims (hereinafter referred to as "this specification and the like") relates to a semiconductor device (e.g., a data retention circuit or a logic circuit), a driving method thereof, and a manufacturing method thereof. Note that one embodiment of the present invention is not limited to the above technical field.

BACKGROUND ART

In a general dynamic random access memory (DRAM), a memory cell includes one transistor (1T) and one capacitor (1C). Such a 1T1C DRAM is a memory capable of retaining data by accumulating electric charge in a capacitor and thus has no limit on the number of times of writing in principle. As a high-capacity memory device, the DRAM is incorporated in a number of electronic devices because of writing and reading at high speed and a small number of elements in memory cells, which easily enable high integration. The 1T1C DRAM performs data reading in such a manner that electric charge accumulated in the capacitor is released to a bit line and a change in a potential is measured; therefore, the electrostatic capacitance of the capacitor needs to be kept at a certain value or more. As a result, miniaturization of its memory cell makes it more and more difficult to keep necessary electrostatic capacitance.

Besides the 1TC1C memory cell, a memory cell called a gain cell including two or three transistors has been proposed (e.g., Patent Documents 1 and 2). In the gain cell, the amount of electric charge can be amplified by a read transistor and the electric charge can be supplied to a bit line; therefore, it is possible to reduce the capacitance of the capacitor.

A transistor including a metal oxide in a channel formation region (hereinafter, such a transistor may be referred to as an oxide semiconductor transistor or an OS transistor) is known. In addition, a memory in which a write transistor of a gain cell is an OS transistor is proposed (e.g., Patent Document 3 and Non-Patent Documents 1 and 2).

In this specification and the like, a memory which is provided with an OS transistor in a memory cell, as described in Patent Document 3, is referred to as an OS memory.

REFERENCE

Patent Document

[Patent Document 1] Japanese Published Patent Application No. 2001-093988
[Patent Document 2] Japanese Published Patent Application No. 2006-012878
[Patent Document 3] Japanese Published Patent Application No. 2011-119675

Non-Patent Document

[Non-Patent Document 1] Y. Yakubo et al., "High-speed and Low-leakage Characteristics of 60-nm C-axis Aligned Crystalline Oxide Semiconductor FET with GHz-ordered Cutoff Frequency," Ext. Abstr. Solid-State Devices and Materials, 2014, pp. 648-649.
[Non-Patent Document 2] T. Matsuzaki et al., "A 128 kb 4 bit/cell Nonvolatile Memory with Crystalline In—Ga—Zn Oxide FET Using Vt Cancel Write Method," *ISSCC Dig. Tech. Papers,* 2015, pp. 306-307.

DISCLOSURE OF INVENTION

Objects of embodiments of the present invention are to provide a novel semiconductor device, to provide a method for driving the novel semiconductor device, to provide a method for using the novel semiconductor device, to improve operation frequency, to provide a semiconductor device whose operation frequency can be changed, to provide a low-power semiconductor device, and to provide a semiconductor device with a memory in which a write cycle time is longer than time for one clock cycle.

One embodiment of the present invention does not necessarily achieve all the objects described above. The description of a plurality of objects does not preclude their coexistence. Other objects will be apparent from the description of this specification and the like, and such objects could be objects of one embodiment of the present invention.

(1) One embodiment of the present invention is a semiconductor device including a processor core, a memory section, and a bus. The memory section includes a first memory; the first memory includes a memory cell; the memory cell includes a first transistor, a second transistor, and a capacitor; a first terminal of the first transistor is electrically connected to a gate of the second transistor; the gate of the second transistor is electrically connected to a first terminal of the capacitor; the processor core is configured to generate a write enable signal; the bus is configured to output the write enable signal to the memory section; the first memory is configured to generate a wait signal on the basis of the write enable signal; the bus is configured to output the wait signal to the processor core; and the processor core is configured to delay access to the memory section by time for n clock cycles (n is an integer of 1 or more), on the basis of the wait signal (2) One embodiment of the present invention is a semiconductor device including a processor core, a memory section, a bus, a register, a clock generator, and a logic section. The memory section includes a first memory; the first memory includes a memory cell; the memory cell includes a first transistor, a second transistor, and a capacitor; a first terminal of the first transistor is electrically connected to a gate of the second transistor; the gate of the second transistor is electrically connected to a first terminal of the capacitor; the processor core is configured to write first data to the register; the register is configured to output the first data to the clock generator and output the first data to the logic section; the clock generator is configured to generate a clock signal with frequency depending on the first data; the logic section is configured to generate a first signal on the basis of the first data and output the first signal to the first memory; the processor core is configured to generate a write enable signal; the bus is configured to output the write enable signal to the memory section; the first memory is configured to generate a wait signal on the basis of the write enable signal and the first signal; the bus is configured to output the wait signal to the processor core; and the processor core is configured to delay access to the memory section by time for m clock cycles (m is an integer of 0 or more), on the basis of the wait signal.

(3) The semiconductor device described in the above embodiment (1) or (2) further includes a third transistor. A first terminal of the second transistor and a first terminal of the third transistor are electrically connected to each other.

(4) In the semiconductor device described in any one of the above embodiments (1) to (3), the memory section includes at least one of an SRAM, a flash memory, an ferroelectric RAM, a magnetoresistive RAM, a resistance RAM, and a phase change RAM.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit and a chip including an integrated circuit are semiconductor devices. Moreover, a storage device, a display device, a light-emitting device, a lighting device, an electronic device, and the like themselves might be semiconductor devices, or might each include a semiconductor device.

In this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts. Each of X and Y denotes an object (e.g., a device, an element, a circuit, a wiring, an electrode, a terminal, a conductive film, or a layer).

Note that a transistor includes three terminals: a gate, a source, and a drain. A gate is a node that controls the conduction state of a transistor. Depending on the channel type of the transistor or levels of potentials applied to the terminals, one of two input/output nodes functions as a source and the other functions as a drain. Therefore, the terms "source" and "drain" can be switched in this specification and the like. In this specification and the like, the two terminals other than the gate may be referred to as a first terminal and a second terminal.

A node can be referred to as a terminal, a wiring, an electrode, a conductive layer, a conductor, an impurity region, or the like depending on a circuit structure, a device structure, and the like. Furthermore, a terminal, a wiring, or the like can be referred to as a node.

Note that voltage refers to a potential difference between a given potential and a reference potential (e.g., a ground potential or a source potential) in many cases. Voltage can be referred to as a potential. Note that a potential has a relative value. Accordingly, a ground potential does not necessarily mean 0 V.

In this specification and the like, the terms "film" and "layer" can be interchanged with each other depending on circumstances or conditions. For example, the term "conductive layer" can be changed into the term "conductive film" in some cases. The term "insulating film" can be changed into the term "insulating layer" in some cases, for example.

In this specification and the like, ordinal numbers such as "first," "second," and "third" are used to avoid confusion among components, and thus do not limit the number of components or do not limit the order.

Embodiments of the present invention can provide a novel semiconductor device, a method for driving the novel semiconductor device, and a method for using the novel semiconductor device, improve operation frequency, and provide a semiconductor device whose operation frequency can be changed, a low-power semiconductor device, and a semiconductor device with a memory in which a write cycle time is longer than time for one clock cycle.

In one embodiment of the present invention, there is no need to achieve all the effects described above. Note that the description of the plurality of effects does not preclude the existence of other effects. In one embodiment of the present invention, an object other than the above objects, an effect other than the above effects, and a novel feature will be apparent from the description of the specification and the drawings.

BRIEF DESCRIPTION OF DRAWINGS

FIG. 17A is a plan view illustrating a structure example of an OS transistor, and FIGS. 17B and 17C are cross-sectional views of the OS transistor in FIG. 17A.

FIG. 18A is a plan view illustrating a structure example of an OS transistor, and FIGS. 18B and 18C are cross-sectional views of the OS transistor in FIG. 18A.

FIG. 19A is a plan view illustrating a structure example of an OS transistor, and FIGS. 19B and 19C are cross-sectional views of the OS transistor in FIG. 19A.

FIG. 21A is a plan view illustrating a structure example of an OS transistor, and FIGS. 21B and 21C are cross-sectional views of the OS transistor in FIG. 21A.

FIG. 22A is a plan view illustrating a structure example of an OS transistor, and FIGS. 22B and 22C are cross-sectional views of the OS transistor in FIG. 22A.

FIG. 23A is a plan view illustrating a structure example of an OS transistor, and FIGS. 23B and 23C are cross-sectional views of the OS transistor in FIG. 23A.

BEST MODE FOR CARRYING OUT THE INVENTION

Figure 1:
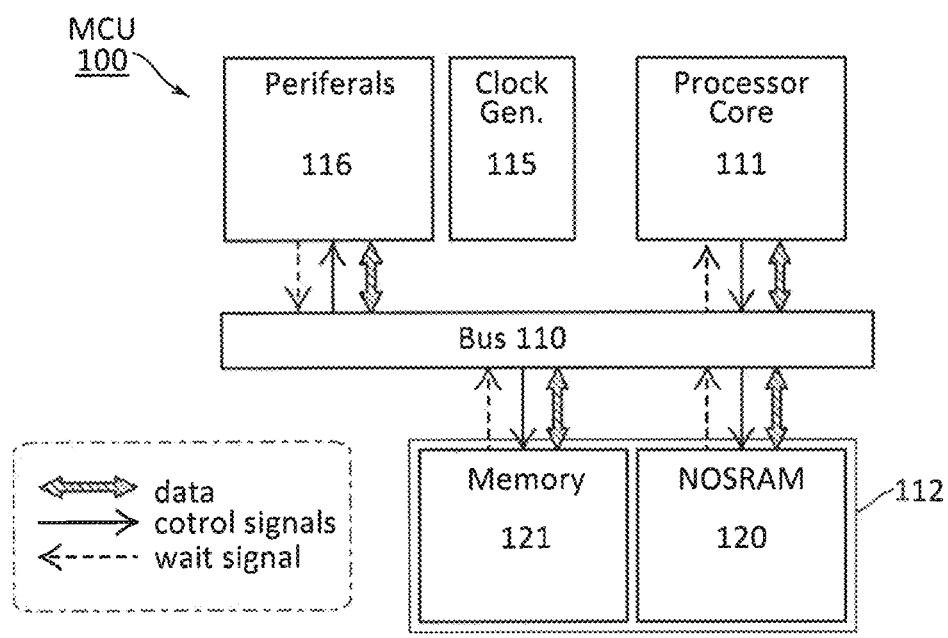
FIG. 1 is a block diagram showing a configuration example of a microcontroller unit (MCU).

An embodiment of the present invention will hereinafter be described. Note that any of the embodiments described in this specification can be combined as appropriate. In addition, in the case where a plurality of structure examples (including operation examples, usage examples, and manufacturing method examples) are given in one embodiment, any of the structure examples can be combined as appropriate. Furthermore, the present invention can be implemented in various different modes, and it is easily understood by those skilled in the art that modes and details of the present invention can be changed in various ways without departing from the spirit and scope of the present invention. Thus, the present invention should not be interpreted as being limited to the following description of the embodiments.

In the drawings, the size, the layer thickness, the region, or the like is exaggerated for clarity in some cases. Therefore, the size, the layer thickness, the region, or the like is not limited to the illustrated scale. Drawings are schematic views of ideal examples, and the embodiments of the present invention are not limited to the shape or the value illustrated in the drawings. For example, the following can be included: variation in signal, voltage, or current due to noise or difference in timing.

In this specification, terms for describing arrangement, such as "over", "above", "under", and "below", are used for convenience in describing a positional relationship between components with reference to drawings in some cases. Furthermore, the positional relationship between components is changed as appropriate in accordance with a direction in which each component is described. Thus, there is no limitation on terms used in this specification, and description can be made appropriately depending on the situation.

The positional relations of circuit blocks illustrated in a block diagram are specified for description; therefore, the positions of circuit blocks of one embodiment of the present invention are not limited thereto. Even when a diagram illustrates that different functions are achieved by different circuit blocks in a block diagram, one circuit block may be actually configured to achieve different functions. Functions of circuit blocks in a diagram are specified for description, and even when a diagram shows one circuit block performing given processing, a plurality of circuit blocks may be actually provided to perform the processing.

Embodiment 1

In this embodiment, a semiconductor device provided with an OS memory is described.

<<MCU>>

FIG. 1 shows a configuration example of a microcontroller unit (MCU). An MCU 100 shown in FIG. 1 includes a bus 110, a processor core 111 (hereinafter referred to as a core 111), a memory section 112, a clock generation circuit 115, and a peripheral circuit 116. The MCU 100 is a semiconductor device which is integrated into one chip.

The clock generation circuit 115 has a function of generating clock signals to be used in the MCU 100. There is no particular limitation of the function of the peripheral circuit 116. In the peripheral circuit 116, various functional circuits are provided in accordance with the use of the MCU 100. Examples of the functional circuits include a power supply circuit, a power supply management unit, a timer device, an interrupt controller, an input/output port, an analog-digital converter (ADC), a comparator, and an operational amplifier.

The memory section 112 includes a NOSRAM 120 and a memory 121. The "NOSRAM" (registered trademark) is a kind of OS memory. The NOSRAM will be described later. The memory 121 is any memory as long as it is rewritable, e.g., an SRAM, a flash memory, an ferroelectric RAM (FeRAM), a magnetoresistive RAM (MRAM), a resistance RAM (ReRAM), or a phase change RAM (PRAM).

The memory 121 is not necessarily provided in the memory section 112. Alternatively, a plurality of memories 121 may be provided in the memory section 112. For example, an SRAM and a flash memory may be provided in the memory section 112. A read-only memory (ROM) may be provided in the memory section 112.

The core 111 exchanges data with the memory section 112 and the peripheral circuit 116 via the bus 110. Control signals from the core 111 are input to the bus 110. The bus 110 sends control signals to a circuit block which is to be controlled. The control signals include an enable signal and an address signal.

The NOSRAM 120, the memory 121, and the peripheral circuit 116 each have a function of issuing wait signals. The wait signal is a signal for requiring the core 111 to delay access. The wait signal that has been input to the bus 110 is transmitted to the core 111.

<NOSRAM>

Figure 2A:
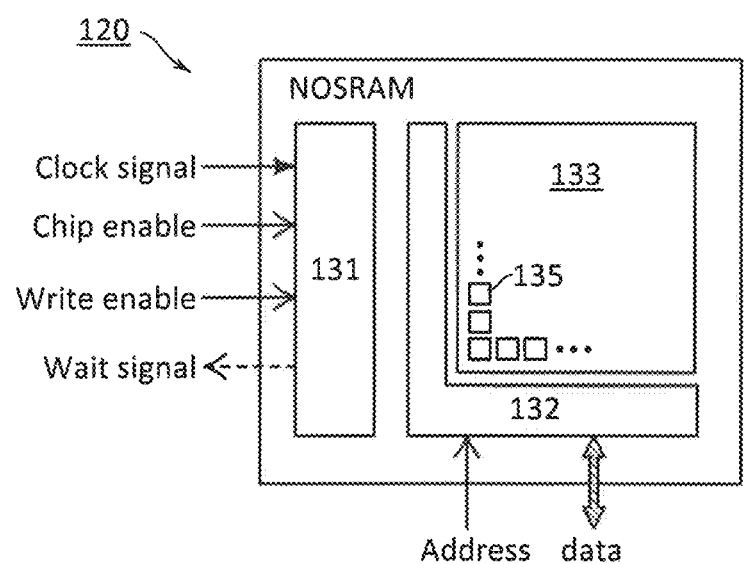
FIG. 2A is a block diagram showing a configuration example of a NOSRAM.

FIG. 2A is a block diagram showing a configuration example of the NOSRAM 120. The NOSRAM 120 shown in FIG. 2A includes a control section 131, a driver section 132, and a cell array 133.

The control section 131 is a logic circuit having a function of controlling the entire operation of the NOSRAM 120. The control section 131 conducts a logical operation of a chip enable signal and a write enable signal and determines whether access of the core 111 is write access or read access. The control section 131 generates a control signal of the driver section 132 on the basis of the logic operation. When the access is write access, the control section 131 issues a wait signal and sends it to the bus 110. When the core 111 receives the wait signal, it delays execution of the next access.

A write enable signal is generated by the core 111. A chip enable signal is generated by the bus 110. The bus 110 generates the chip enable signal on the basis of an address signal and a write enable signal which are output from the core 111.

The driver section 132 is a circuit for writing and reading data to/from the cell array 133. The driver section 132 includes a decoder for decoding an address signal, a word line driver, a read circuit, a write circuit, and the like, for example.

Figure 2B:
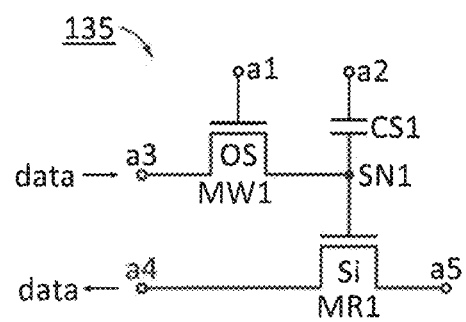
FIG. 2B is a circuit diagram showing a configuration example of a memory cell.

Memory cells 135 are arranged in a matrix in the cell array 133. FIG. 2B illustrates a configuration example of the memory cell 135. Here, the memory cell 135 is a 2T-type gain cell. The memory cell 135 includes a transistor MW1, a transistor MR1, a capacitor CS1, a node SN1, and nodes a1 to a5. The transistor MW1 is an OS transistor serving as a write transistor. The transistor MR1 is a read transistor and is an n-channel Si transistor in the example of FIG. 2B. The node SN1 is a data retention node, and the capacitor CS1 is a storage capacitor for retaining charge of the node SN1.

An OS transistor is preferably used as a transistor in the memory cell because of its extremely low off-state current. Here, an off-state current refers to a current that flows between a source and a drain of a transistor in an off state. In the case of an n-channel transistor, for example, when the threshold voltage of the transistor is approximately 0 V to 2 V, a current flowing between a source and a drain when a voltage between a gate and the source is negative can be referred to as an off-state current. An extremely low off-state current means that, for example, an off-state current per micrometer of channel width is lower than or equal to 100 zA (z represents zepto and denotes a factor of $10^{-21}$). Since the off-state current is preferably as low as possible, the normalized off-state current is preferably lower than or equal to 10 zA/μm or lower than or equal to 1 zA/μm), further preferably lower than or equal to 10 yA/μm (y represents yocto and denotes a factor of $10^{-24}$).

An oxide semiconductor has a bandgap of 3.0 eV or higher; thus, an OS transistor has a low leakage current due to thermal excitation and, as described above, has an extremely low off-state current. An oxide semiconductor used as a channel formation region of an OS transistor is preferably an oxide semiconductor containing at least one of indium (In) and zinc (Zn). Typical examples of such an oxide semiconductor include an In-M-Zn oxide (the element M is Al, Ga, Y, or Sn, for example). By reducing impurities serving as electron donors, such as moisture or hydrogen, and also reducing oxygen vacancies, an i-type (intrinsic) or a substantially i-type oxide semiconductor can be obtained. Here, such an oxide semiconductor can be referred to as a highly-purified oxide semiconductor. By using a highly purified oxide semiconductor, the off-state current of the OS transistor which is normalized by the channel width can be as low as several yoctoamperes per micrometer to several zeptoamperes per micrometer. An OS transistor and an oxide semiconductor will be described in Embodiments 5 and 6.

To write data to the memory cell 135, data is input to the node a3. The node a1 is set to "H" to turn on the transistor MW1; as a result, the data of the node a3 is written to the node SN1. The transistor MW1 is turned off and the node SN1 is turned into a floating state, whereby data writing is completed.

The voltage of the node a4 is read out as data. Data is read out in the following manner, for example. The potential of the node a5 is fixed. The node a4 is precharged and then turned into a floating state. A drain current depending on the voltage of the node SN1 flows through the transistor MR1. Therefore, the voltage of the node a4 changes in accordance with the voltage of the node SN1.

Because of the feature of the OS transistor, i.e., extremely low off-state current, reduction in the voltage of the node SN1 can be prevented and almost no power is consumed to retain data; therefore, the memory cell 135 is capable of retaining data for a long time, i.e., involatile. In this specification and the like, an OS memory with a cell array composed of gain cells is called a nonvolatile oxide semiconductor RAM (NOSRAM). A NOSRAM has the following feature in addition to long-term data retention.

There is theoretically no limitation on the number of rewriting operations of a NOSRAM because data is rewritten by charging and discharging of the capacitor; and data can be written/read to/from a NOSRAM with low energy. Owing to a simple circuit configuration of memory cells, the capacity of a NOSRAM can be easily increased. Therefore, by mounting a NOSRAM, a low-power MCU including a large-capacity memory section can be provided. Thus, a NOSRAM is suitably used as a large-capacity memory because of its high rewriting resistance. However, since the memory cells of the NOSRAM have a simple circuit configuration, the performance of the NOSRAM as a memory module is largely influenced by the electrical characteristics of the OS transistor.

An OS transistor has a low on-state current than a Si transistor. The writing speed of a memory cell of a NOSRAM is lower than the reading speed thereof because data is written to the memory cell by a switching operation of the OS transistor. Therefore, the clock frequency of an MCU which includes the NOSRAM is limited by the writing speed of the NOSRAM. In other words, it is highly difficult to mount a NOSRAM on an MCU which has high operation frequency. This embodiment can provide an MCU which is free from such a problem.

Specifically, in the MCU 100 shown in FIG. 1, when the core 111 receives a wait signal from the NOSRAM 120, the core 111 assigns (n+1) clock cycles (n is an integer of 1 or more) to a write cycle for the memory section 112. An operation example of the MCU 100 is described below with reference to FIG. 3 and FIG. 4.

<<Operation Example of MCU>>

Figure 3:
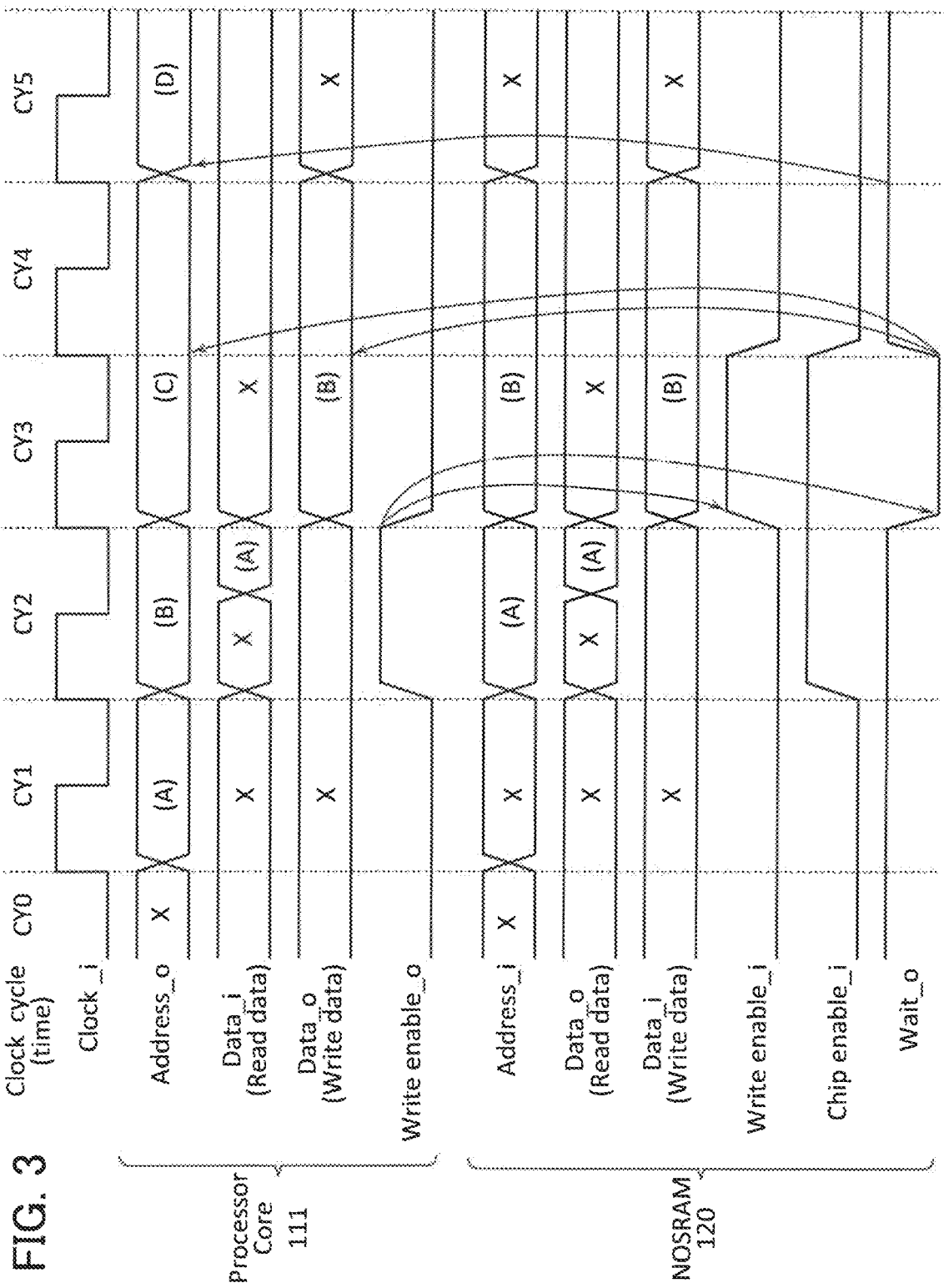
FIG. 3 is a timing chart showing an operation example of an MCU.
Figure 4:
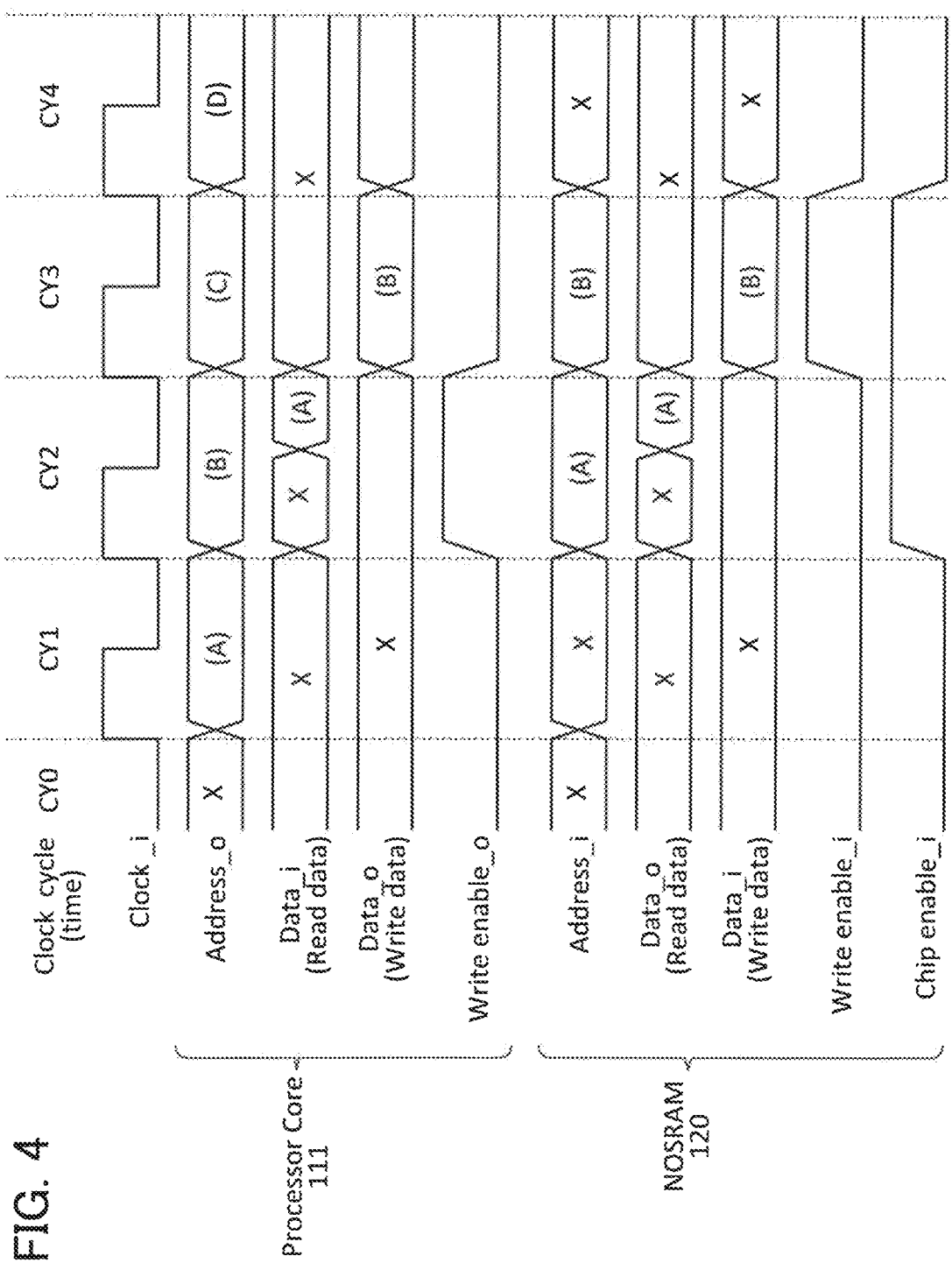
FIG. 4 is a timing chart showing an operation example of an MCU.

FIG. 3 and FIG. 4 are each a timing chart showing access of the core 111 to the memory section 112. In FIG. 3 and FIG. 4, CY0, CY1, and the like represent clock cycles. In addition, "_o" represents an output signal to the bus 110, and "_i" represents an input signal from the bus 110. For example, "Address_o" represents an address signal which the core 111 outputs to the bus 110, and "Address_i" represents an address signal which is input from the bus 110 to the NOSRAM 120. Data which has been read from the NOSRAM 120 is input to the core 111. Data which the core 111 has output is written to the NOSRAM 120.

FIG. 3 and FIG. 4 show details of access to addresses (A) and (B). Addresses relating to the other operations and data are abbreviated to "X" in FIG. 3 and FIG. 4. The addresses (A) and (B) are addresses of the NOSRAM 120, and addresses (C) and (D) are addresses of the memory 121. The core 111 performs reading of data (A) from the address (A) and writing of data (B) to the address (B).

Reference Example

First, an operation example of the MCU 100 in the case where the NOSRAM 120 does not have a function of generating a wait signal is described as a reference example. FIG. 4 is a timing chart showing access of the core 111 to the NOSRAM 120.

In a clock cycle CY1, the core 111 outputs the address (A) and a write enable signal of "L" to the bus 110. Next, in a clock cycle CY2, the address (A), the write enable signal of "L", and a chip enable signal of "H" are input to the NOSRAM 120. Since the write enable signal is at "L", the NOSRAM 120 reads out the data (A) that is stored in the address (A). The data (A) is input to the core 111 via the bus 110.

In addition, after the core 111 issues the address (A), the core 111 outputs the address (B) and a write enable signal of "H" to the bus 110 in the clock cycle CY2 and outputs the data (B) to the bus 110 in a clock cycle CY3. In the clock cycle CY3, the address (B), the data (B), the write enable signal of "H", and a chip enable signal of "H" are input to the NOSRAM 120. In the clock cycle CY3, the NOSRAM 120 writes the data (B) to the address (B).

In the clock cycle CY3, the core 111 outputs the address (C) to the bus 110. Since the address (C) is an address of the memory 121, the bus 110 outputs a chip enable signal of "L" to the NOSRAM 120 in a clock cycle CY4.

One clock cycle is assigned to each of a write cycle and a read cycle of the NOSRAM 120 in the example of FIG. 4. Therefore, time for one clock cycle cannot be shorter than the write cycle time of the NOSRAM 120. For example, in the case where the data write cycle time of the NOSRAM 120 is 20 ns, the operation frequency of the MCU 100 cannot be higher than 50 MHz (the time for one clock cycle=20 ns).

This embodiment can provide an MCU whose operation frequency is not limited by the write cycle time of the NOSRAM, which is described with reference to the timing chart of FIG. 3. FIG. 3 is a timing chart showing access of the core 111 to the NOSRAM 120.

In FIG. 3, the wait signal of "L" is active, and the wait signal of "H" is inactive.

An operation of read access is similar to that of the reference example in FIG. 4. The core 111 issues the address (A) in the clock cycle CY1, and the NOSRAM 120 reads out the data (A) in the clock cycle CY2. The read operation of the NOSRAM 120 can be performed at a high speed; therefore, data which the NOSRAM 120 has been read out is delivered to the core 111 in the clock cycle in which the core 111 issues the address.

An operation of write access is different from that of the reference example in FIG. 4. In the clock cycle CY2, the core 111 outputs the address (B) and a write enable signal of "H" to the bus 110. In the clock cycle CY3, the address (B), the write enable signal of "H", and a chip enable signal of "H" are input to the NOSRAM 120. Since the write enable signal is at "H" at the rise of the clock signal, the NOSRAM 120 outputs a wait signal of "L".

In the clock cycle CY4, the logic of the wait signal is "L" at the rise of the clock signal; therefore, the core 111 delays requirement for access to the memory section 112 and executes the same processing as that in the clock cycle CY3. Thus, in the NOSRAM 120, writing of the data (B) to the address (B) can be performed in two clock cycles (CY3 and CY4).

In a clock cycle CY5, the logic of the wait signal is "H" at the rise of the clock signal; therefore, the core 111 executes the delayed access requirement. In the example of FIG. 3, the core 111 issues the address (D).

Although two clock cycles are assigned to the write cycle of the NOSRAM 120 in the example of FIG. 3, the number of clock cycles assigned to the write cycle is not limited to two. (n+1) clock cycles (n is an integer of 1 or more) can be assigned to the write cycle of the NOSRAM 120. In that case, a period during which the wait signal is at "L" corresponds to time for n clock cycles.

A case where the write cycle time of the NOSRAM 120 is 20 ns is assumed. In the case where the frequency of clock signals is 100 MHz (clock cycle time=10 ns), active wait signals are issued during one clock cycle, and two clock cycles are assigned to the write cycle. In the case where the frequency of clock signals is 200 MHz (clock cycle time=5 ns), active wait signals are issued during three clock cycles, and four clock cycles are assigned to the write cycle.

Note that a wait signal of "H" indicates that the NOSRAM 120 can receive access of the core 111, and a wait signal of "L" indicates that the NOSRAM 120 cannot receive access of the core 111; therefore, a wait signal can be regarded as a ready signal.

The operation frequency of the processor core is not limited by the write cycle time of the NOSRAM. That is, an operation in accordance with the performance of the NOSRAM is possible; therefore, the MCU can include a low-power NOSRAM while the performance of the whole system of the MCU is maintained. Since the MCU can incorporate the NOSRAM, it can be a high-performance low-power MCU with a large-capacity memory section.

One mode of the invention has been described in this embodiment using the MCU as an example. However, application of this embodiment is not limited to the MCU, and this embodiment can be applied to various processors with processor cores and memory sections.

Embodiment 2

In this embodiment, an MCU is described as an example of a semiconductor device provided with an OS memory. In the MCU of this embodiment, the write cycle time of the NOSRAM can be changed in accordance with the frequency of clock signals used in the MCU.

<<MCU>>

Figure 5A:
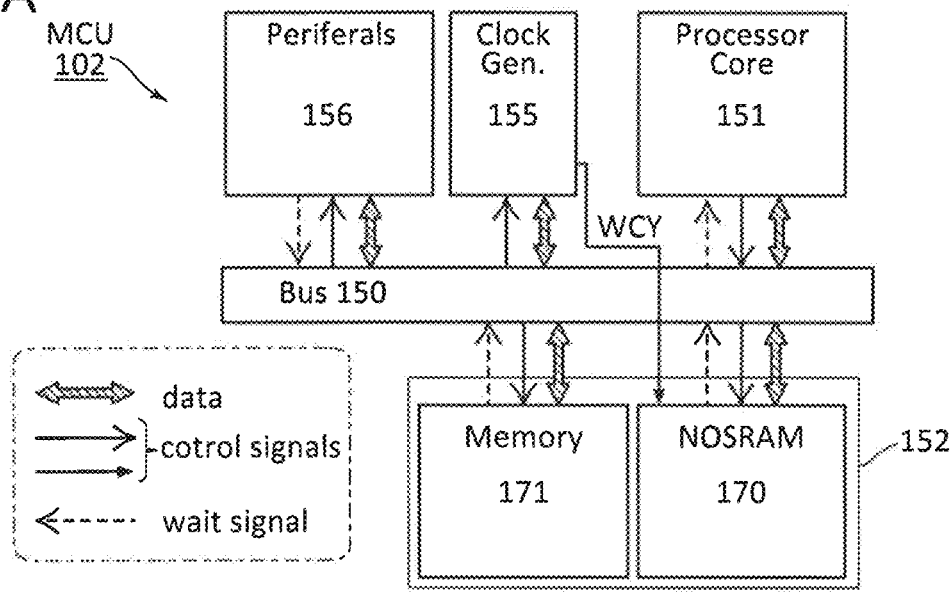
FIG. 5A is a block diagram showing a configuration example of an MCU.

FIG. 5A shows an configuration example of an MCU. An MCU 102 shown in FIG. 5A includes a bus 150, a processor core 151 (hereinafter referred to as a core 151), a memory section 152, a clock generation circuit 155, and a peripheral circuit 156. The MCU 102 is a semiconductor device which is integrated into one chip.

The core 151 exchanges data with the memory section 152 and the peripheral circuit 156 via the bus 150. Control signals from the core 151 are input to the bus 150. The bus 150 sends control signals to a circuit block which is to be controlled. The control signals include an enable signal and an address signal.

There is no particular limitation of the function of the peripheral circuit 156. In the peripheral circuit 156, various functional circuits are provided in accordance with the use of the MCU 102. Examples of the functional circuits include a power supply circuit, a power supply management unit, a timer device, an interrupt controller, an input/output port, an analog-digital converter (ADC), a comparator, and an operational amplifier.

The memory section 152 includes a NOSRAM 170 and a memory 171. The memory 171 is any memory as long as it is rewritable, e.g., an SRAM, a flash memory, an ferroelectric RAM (FeRAM), a magnetoresistive RAM (MRAM), a resistance RAM (ReRAM), or a phase change RAM (PRAM).

The memory 171 is not necessarily provided in the memory section 152. Alternatively, a plurality of memories 171 may be provided in the memory section 152. For example, an SRAM and a flash memory may be provided in the memory section 152. A read-only memory (ROM) may be provided in the memory section 152.

The NOSRAM 170, the memory 171, and the peripheral circuit 156 each have a function of issuing wait signals. The wait signal is a signal for requiring the core 151 to delay access. The wait signal that has been input to the bus 150 is transmitted to the core 151.

Figure 5B:
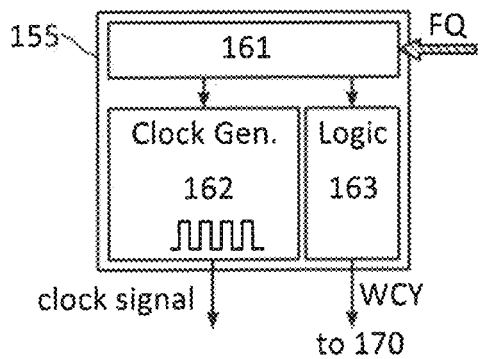
FIG. 5B is a block diagram showing a configuration example of a clock signal generation circuit.

The clock generation circuit 155 has a function of generating clock signals to be used in the MCU 102. The clock generation circuit 155 has a function of changing the clock frequency on the basis of data for setting the frequency stored in the clock generation circuit 155. Rewriting of the data for setting the frequency is performed by the core 151. FIG. 5B shows a configuration example of the clock generation circuit 155.

<Clock Generation Circuit>

The clock generation circuit 155 includes a configuration register 161, a clock generator 162, and a logic section 163. The configuration register 161 has a function of storing data FQ for setting clock frequency (hereinafter referred to as data FQ). The data FQ of the configuration register 161 can be rewritten by control by the core 151. The configuration register 161 outputs the data FQ to the clock generator 162 and the logic section 163.

The clock generator 162 generates a clock signal which has frequency which depends on the data FQ. The clock signal generated by the clock generator 162 is to be used in the MCU 102.

The logic section 163 has a function of generating a signal WCY on the basis of the data FQ. The signal WCY is input to the NOSRAM 170 without through the bus 150. The signal WCY has a function of setting the number of clock cycles assigned to the write cycle of the NOSRAM 170.

Since the frequency of clock signals can be changed by the clock generation circuit 155, high performance and low power consumption can be achieved in the MCU 102. The clock frequency is increased when higher processing is needed. The clock frequency can be reduced in order to reduce power (e.g., in driving with a battery).

<NOSRAM>

Figure 6A:
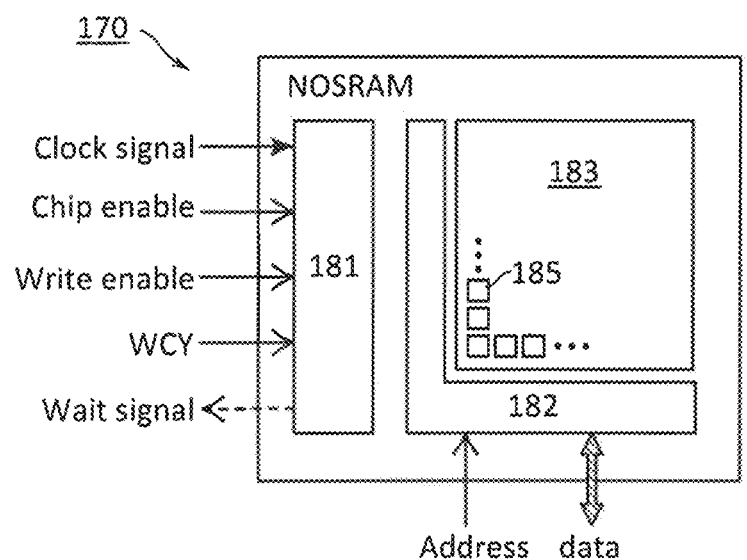
FIG. 6A is a block diagram showing a configuration example of a NOSRAM.

FIG. 6A is a block diagram showing a configuration example of the NOSRAM 170. The NOSRAM 170 shown in FIG. 6A includes a control section 181, a driver section 182, and a cell array 183.

The control section 181 is a logic circuit having a function of controlling the entire operation of the NOSRAM 170. The control section 181 has a function of conducting a logical operation of a chip enable signal and a write enable signal and determining whether access of the core 151 is write access or read access, a function of conducting a logical operation of the chip enable signal, the write enable signal, and the signal WCY and generating a control signal for the driver section 182, and a function of issuing a wait signal on the basis of the write enable signal and the signal WCY.

With write access from the core 151, the control section 181 issues a wait signal and sends it to the bus 150. When the core 151 receives the wait signal, the core 151 delays execution of the next access.

A write enable signal is generated by the core 151. A chip enable signal is generated by the bus 150. The bus 150 generates the chip enable signal on the basis of an address signal and a write enable signal which are output from the core 151.

The driver section 182 is a circuit for writing and reading data to/from the cell array 183. The driver section 182 includes a decoder for decoding an address signal, a word line driver, a read circuit, a write circuit, and the like, for example.

Figure 6B:
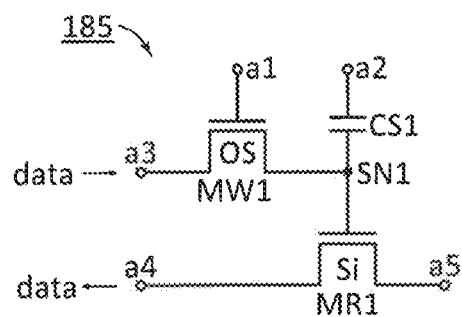
FIG. 6B is a circuit diagram showing a configuration example of a memory cell.

Memory cells 185 are arranged in a matrix in the cell array 183. FIG. 6B illustrates a configuration example of the memory cell 185. The circuit configuration of the memory cell 185 is the same as that of the memory cell 135 in FIG. 2B.

As described in Embodiment 1, since an OS transistor has a lower on-state current than a Si transistor, the clock frequency of an MCU incorporating a NOSRAM is limited by the writing speed of the NOSRAM. This embodiment can solve such a problem to provide an MCU whose operation frequency is not limited by the writing speed of the NOSRAM.

Specifically, the data FQ of the configuration register 161 is rewritten by the core 151, whereby the clock frequency and the write cycle time of the NOSRAM 170 can be optimized. Table 1 shows examples of the clock frequency and the write cycle time which are set depending on the data FQ. Here, the clock frequency is set to any of 10 MHz, 50 MHz, 100 MHz, and 200 MHz.

TABLE 1

| Configuration register 161 | | Logic section 163 | |
| --- | --- | --- | --- |
| FQ | Clock frequency | WCY | Write cycle |
| 2'b00 | 10 MHz | 2'b00 | 1 clock cycle |
| 2'b01 | 50 MHz | 2'b00 | 1 clock cycle |
| 2'b10 | 100 MHz | 2'b01 | 2 clock cycles |
| 2'b11 | 200 MHz | 2'b10 | 4 clock cycles |

The data FQ is 2-bit data. When the core 151 writes 2'b00 to the configuration register 161, the clock generator 162 generates clock signals at 10 MHz, whereas when the core 151 writes 2'b11 to the configuration register 161, the clock generator 162 generates clock signals at 200 MHz.

Table 1 corresponds to a truth table of the logic section 163. Here, the write cycle time of the NOSRAM 170 is assumed to be optimized to 20 ns. Note that 20 ns corresponds to time for one clock cycle in the case where the clock frequency is 50 MHz. When the clock frequency is higher than 50 MHz, two or more clock cycles need to be assigned to the write cycle of the NOSRAM 170. Thus, in the MCU 102, the number of clock cycles require for the write cycle of the NOSRAM 170 is controlled by the signal WCY.

When 2'b01 is written to the configuration register 161, the logic section 163 outputs the signal WCY of 2'b00 to the NOSRAM 170, whereas when 2'b10 is written to the configuration register 161, the logic section 163 outputs the signal WCY of 2'b01 to the NOSRAM 170. When the NOSRAM 170 receives a write enable signal, the NOSRAM 170 generates a wait signal on the basis of the data of the signal WCY. Here, the value of the signal WCY represents a clock cycle time in which the NOSRAM 170 issues a wait signal.

Although the bit widths of the data FQ and the signal WCY are each two bits in the example of Table 1, one embodiment of the present invention is not limited thereto. The bit width of the data FQ can be determined in accordance with the number of use of the clock frequency. The bit width of the signal WCY can be determined in accordance with the clock frequency and the writing characteristics of the NOSRAM 170.

<<Operation Example of MCU>>

Figure 7:
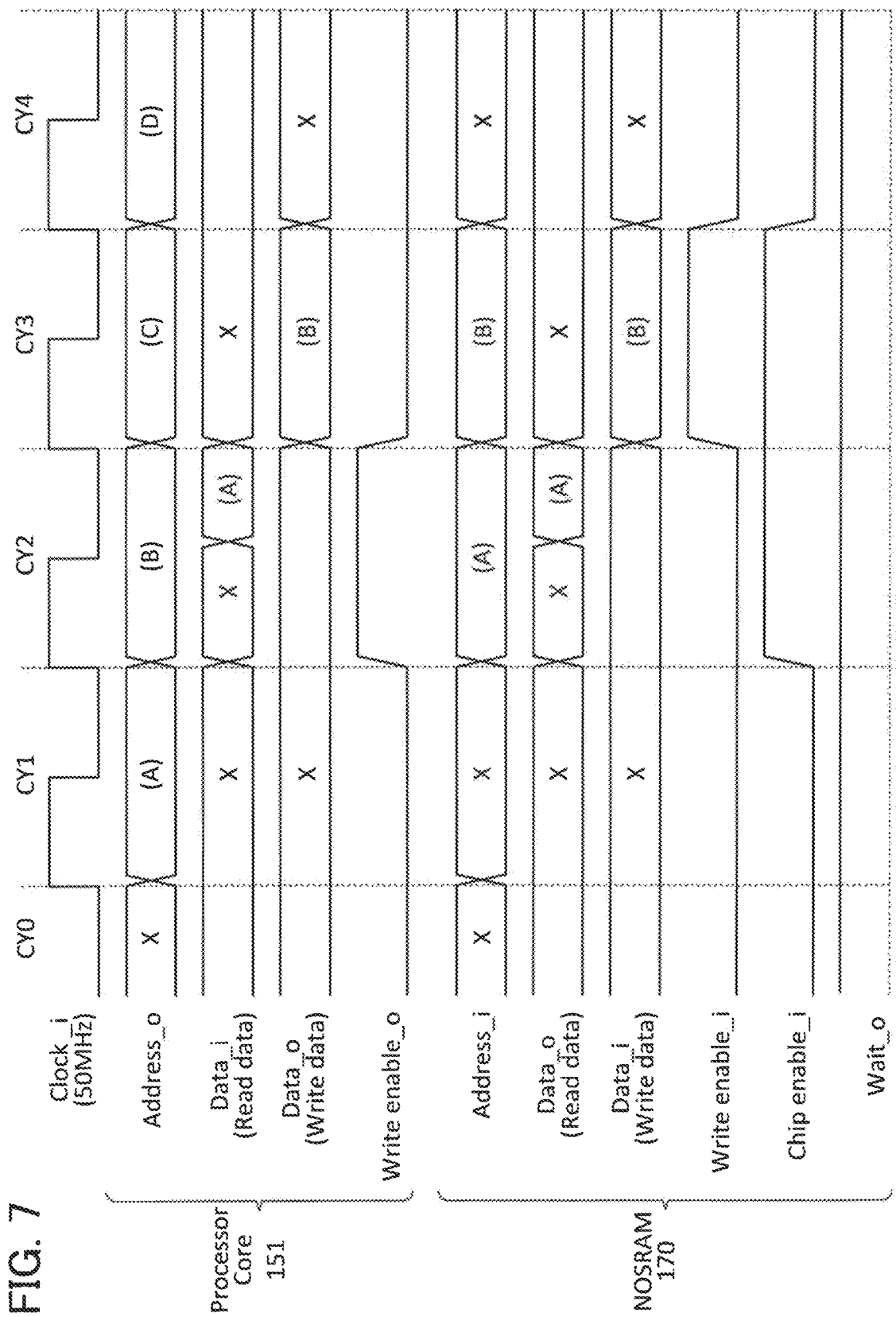
FIG. 7 is a timing chart showing an operation example of an MCU.
Figure 8:
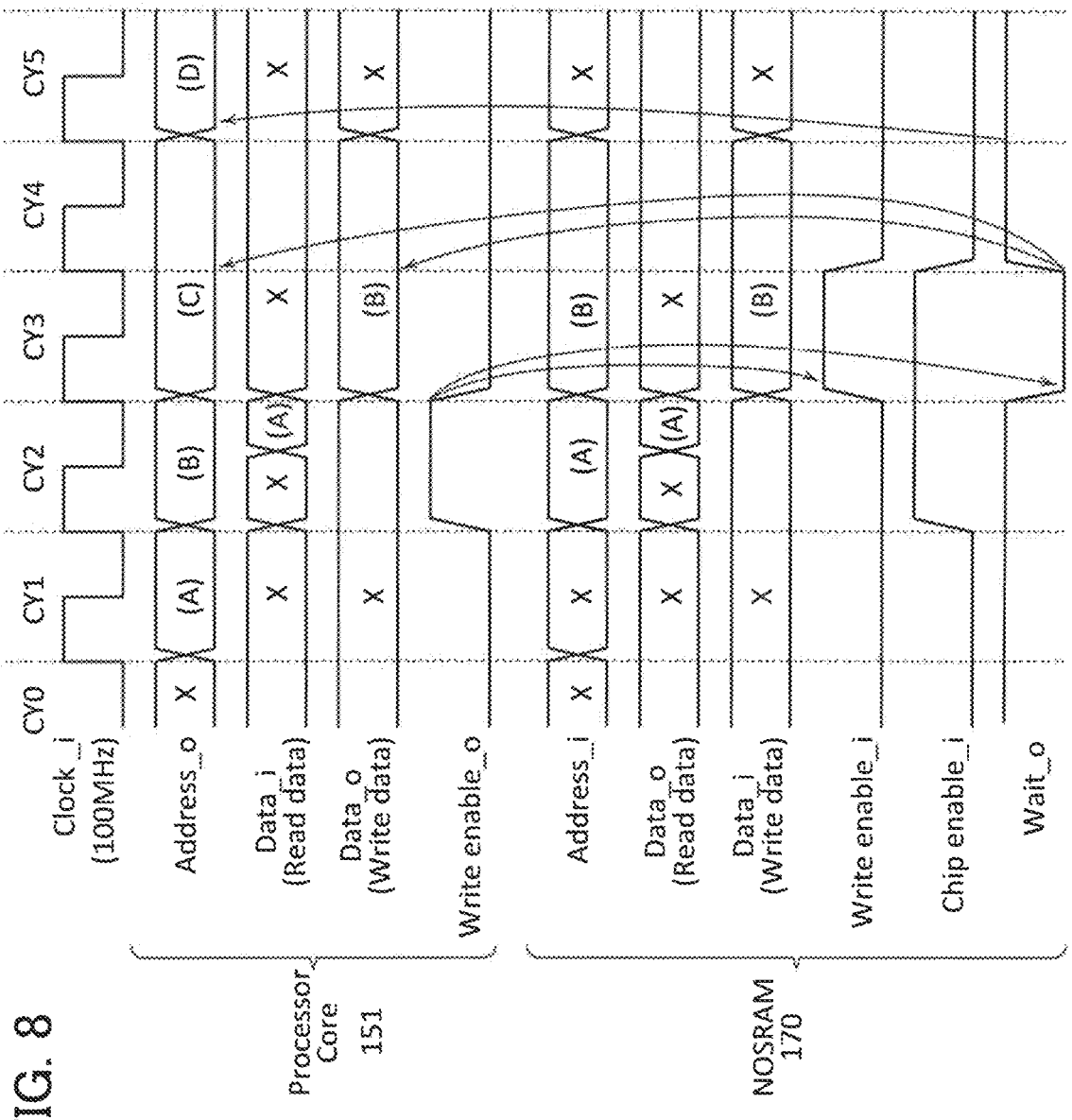
FIG. 8 is a timing chart showing an operation example of an MCU.

An operation example of the MCU 102 is described below with reference to FIG. 7 and FIG. 8. FIG. 7 and FIG. 8 are each a timing chart showing access of the core 151 to the memory section 152. The clock frequency is 50 MHz in the example of FIG. 7 and 100 MHz in the example of FIG. 8.

In FIG. 7 and FIG. 8, CY0, CY1, and the like represent clock cycles. In addition, "_o" represents an output signal to the bus 150, and "_i" represents an input signal from the bus 150. For example, "Address_o" represents an address signal which the core 151 outputs to the bus 110, and "Address_i" represents an address signal which is input from the bus 150 to the NOSRAM 170. Data which has been read from the NOSRAM 170 is input to the core 151. Data which the core 151 has output is written to the NOSRAM 170.

FIG. 7 and FIG. 8 show details of access to addresses (A) and (B). Addresses relating to the other operations and data are abbreviated to "X" in FIG. 7 and FIG. 8. The addresses (A) and (B) are addresses of the NOSRAM 170, and addresses (C) and (D) are addresses of the memory 171. The core 151 performs reading of data (A) from the address (A) and writing of data (B) to the address (B).

Here, the wait signal of "L" is active, and the wait signal of "H" is inactive.

Operation Example 1

An operation example of the MCU 102 in the case where the write cycle time of the NOSRAM 170 corresponds to time for one clock cycle is described with reference to FIG. 7.

In the clock cycle CY1, the core 151 outputs the address (A) and a write enable signal of "L" to the bus 150. Next, in the clock cycle CY2, the address (A), the write enable signal of "L", and a chip enable signal of "H" are input to the NOSRAM 170. Since the write enable signal is at "L", the NOSRAM 170 reads out the data (A) that is stored in the address (A). The data (A) is input to the core 151 via the bus 150.

In addition, after the core 151 issues the address (A), the core 151 outputs the address (B) and a write enable signal of "H" to the bus 150 in the clock cycle CY2 and outputs the data (B) to the bus 150 in the clock cycle CY3. In the clock cycle CY3, the address (B), the data (B), the write enable signal of "H", and a chip enable signal of "H" are input to the NOSRAM 170. In the clock cycle CY3, the NOSRAM 170 writes the data (B) to the address (B).

In the clock cycle CY3, the core 151 outputs the address (C) to the bus 150. Since the address (C) is an address of the memory 171, the bus 150 outputs a chip enable signal of "L" to the NOSRAM 170 in the clock cycle CY4.

Operation Example 2

An operation example of the MCU 102 in the case where the write cycle time of the NOSRAM 170 corresponds to time for two clock cycles is described with reference to FIG. 8.

Read access is executed in a manner similar to that in FIG. 7. The core 151 issues the address (A) in the clock cycle CY1, and the NOSRAM 170 reads out the data (A) in the clock cycle CY2. The read operation of the NOSRAM 170 can be performed at a high speed; therefore, data which the NOSRAM 170 has been read out is delivered to the core 151 in the clock cycle in which the core 151 issues the address.

Write access is different from that in the operation of FIG. 7: the write cycle of the NOSRAM 170 is executed in two clock cycles.

In the clock cycle CY2, the core 151 outputs the address (B) and a write enable signal of "H" to the bus 150. In the clock cycle CY3, the address (B), the write enable signal of "H", and a chip enable signal of "H" are input to the NOSRAM 170. Since the write enable signal is at "H" at the rise of the clock signal, the NOSRAM 170 outputs a wait signal of "L". In the clock cycle CY4, the NOSRAM 170 makes the wait signal inactive.

In the clock cycle CY4, the logic of the wait signal is "L" at the rise of the clock signal; therefore, the core 151 delays requirement for access to the memory section 152 and executes the same processing as that in the clock cycle CY3. In the clock cycle CY5, the logic of the wait signal is "H" at the rise of the clock signal; therefore, the core 151 executes the delayed access requirement. In the example of FIG. 8, the core 151 issues the address (D).

Figure 5C:
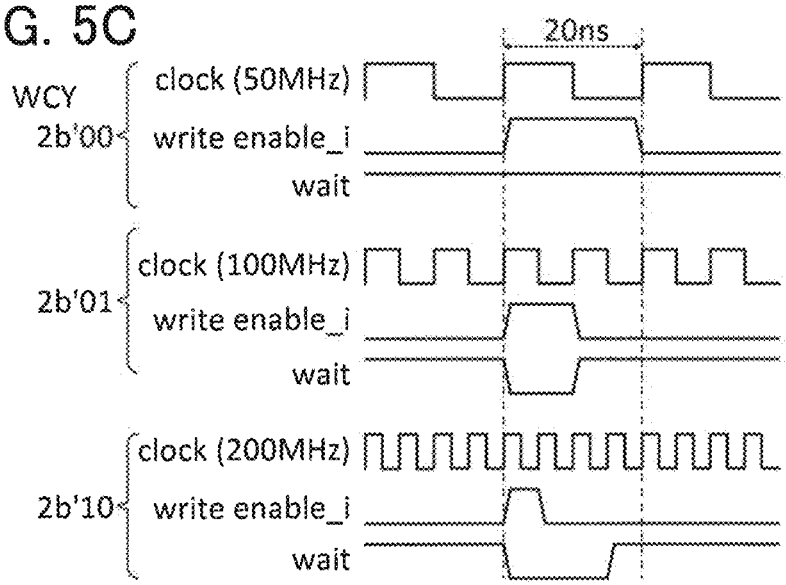
FIG. 5C is a timing chart showing structure examples of wait signals.

In accordance with the signal WCY, (m+1) clock cycles are assigned to the write cycle of the NOSRAM 170. Note that m is an integer of 0 or more. Here, the data of the signal WCY represents clock cycle time in which the wait signal is active (see FIG. 5C). In other words, the data of the signal WCY represents the number of clock cycles by which the core 151 delays its access to the memory section 152.

When the signal WCY is 2'b00, the NOSRAM 170 outputs a wait signal of "H" even when a write enable signal is input. That is, the NOSRAM 170 issues no wait signal. The NOSRAM 170 issues active wait signals during one clock cycle when the signal WCY is 2'b01 and issues them during three clock cycles when the signal WCY is 2'b10.

Note that a wait signal of "H" indicates that the NOSRAM 170 can receive access of the core 151, and a wait signal of "L" indicates that the NOSRAM 170 cannot receive access of the core 151; therefore, a wait signal can be regarded as a ready signal.

In the MCU of this embodiment, the operation frequency can be changed without being limited by the write cycle time of the NOSRAM. The operation frequency of the MCU can be set in accordance with the kind of processing of the MCU or the like, resulting in reduction in the power consumption of the whole MCU.

In this embodiment, control in accordance with the performance of the NOSRAM is possible; therefore, the MCU can include a low-power NOSRAM while the performance of the whole system of the MCU is maintained. Since the MCU can incorporate the NOSRAM, it can be a high-performance low-power MCU with a large-capacity memory section.

One mode of the invention has been described in this embodiment using the MCU as an example. However, application of this embodiment is not limited to the MCU, and this embodiment can be applied to various processors with processor cores and memory sections.

Embodiment 3

More specific configuration example of the NOSRAM is described in this embodiment. A NOSRAM which can be mounted on the MCU described in Embodiment 2 is described in this embodiment.

<<Configuration Example of NOSRAM>>

Figure 9A:
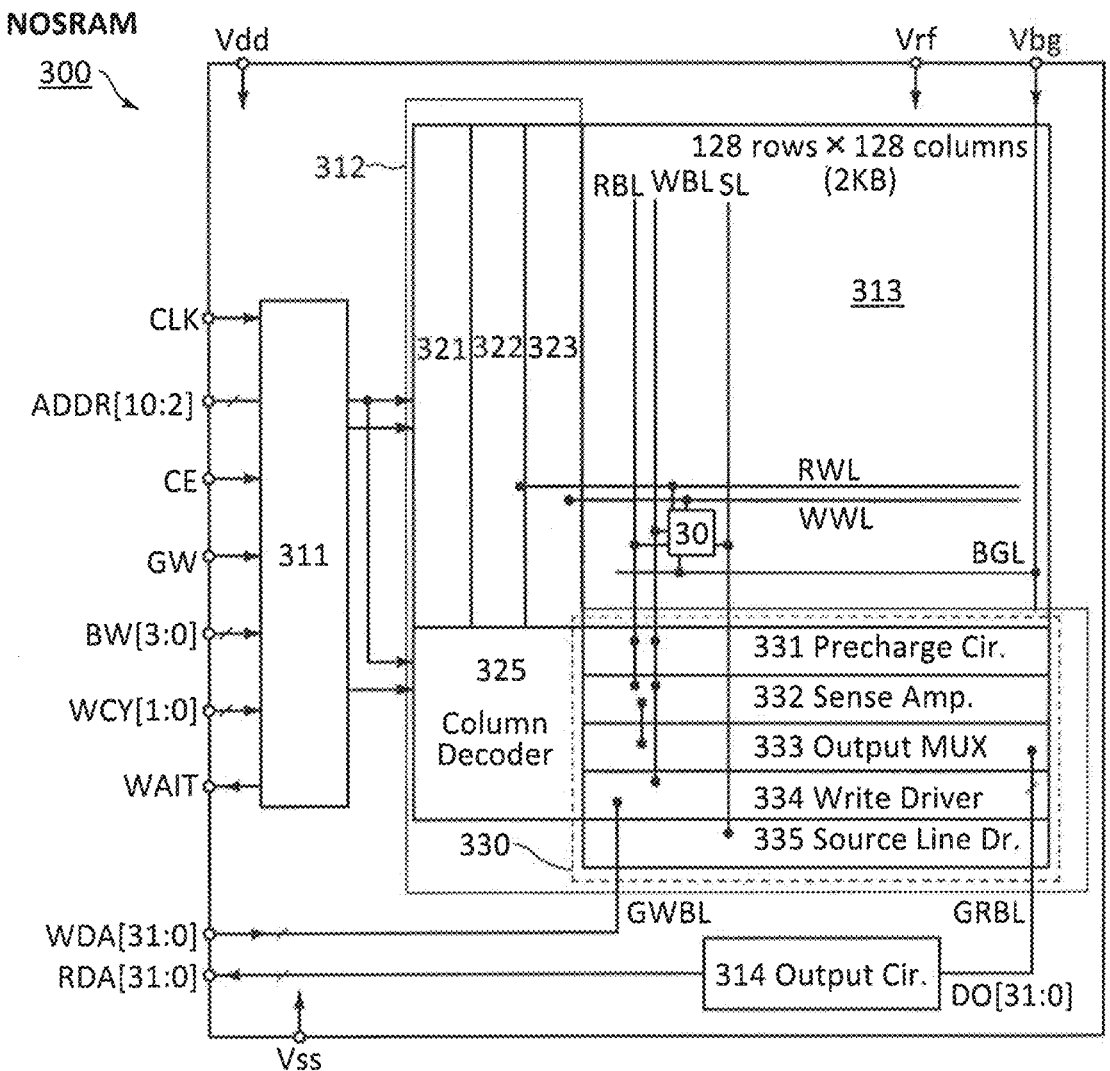
FIG. 9A is a block diagram showing a configuration example of a NOSRAM.

FIG. 9A is a block diagram showing a configuration example of a NOSRAM. A NOSRAM 300 shown in FIG. 9A includes a control section 311, a driver section 312, a cell array 313, and an output circuit 314.

The NOSRAM 300 is supplied with signals CLK, CE, GW, BW[3:0], WCY[1:0], and ADDR[10:2] and outputs a signal WAIT. The signal CLK is a clock signal, the signal CE is a chip enable signal, the signal GW is a write enable signal, the signals BW[3:0] are byte write enable signals, and the signals ADDR[10:2] are address signals. The signal WAIT is a wait signal. Data WDA[31:0] is write data, and data RDA[31:0] is read data.

In the NOSRAM 300, the signal GW corresponds to the above-described write enable signal. The NOSRAM 300 issues the signal WAIT on the basis of the signals GW and WCY. Here, the relationship between the signal WCY and a write cycle follows Table 1.

Voltages Vdd, Vss, Vrf, and Vbg are input to the NOSRAM 300. The voltage Vdd is a high power supply voltage, and the voltage Vss is a low power supply voltage. The voltage Vbg is input to the cell array 313, and the voltage Vrf is input to the driver section 312.

The cell array 313 includes a plurality of memory cells 30, a plurality of wirings WWL, a plurality of wirings RWL, a plurality of wirings WBL, a plurality of wirings RBL, a plurality of wirings SL, and a plurality of wirings BGL. The memory cells 30 are arranged in a matrix. The wirings WWL and the like are provided in accordance with the arrangement of the memory cells 30. The wirings WWL are write word lines, the wirings RWL are read word lines. The wirings WBL are write bit lines, the wirings RBL are read bit lines, and the wirings SL are source lines. The wirings BGL are wirings for supplying the voltage Vbg.

The NOSRAM 300 in FIG. 9A has a capacity of 2 KB. The memory cells 30 in the cell array 313 are arranged in a matrix of 128 rows and 128 columns. Here, 32 wirings GWBL (global write bit lines) are provided for the 128 wirings WBL, and 32 wirings GRBL (global read bit lines) are provided for the 128 wirings RBL.

The decision whether each circuit, each signal, and each voltage are used in the NOSRAM 300 or not can be made as appropriate as needed. Another circuit or another signal may further be used. Structures (e.g., bit lengths) of input and output signals to/from the NOSRAM 300 are set on the basis of the architecture of the MCU, the operation mode of the NOSRAM 300, the configuration of the cell array 313, and the like.

(Cell Array)

Figure 9B:
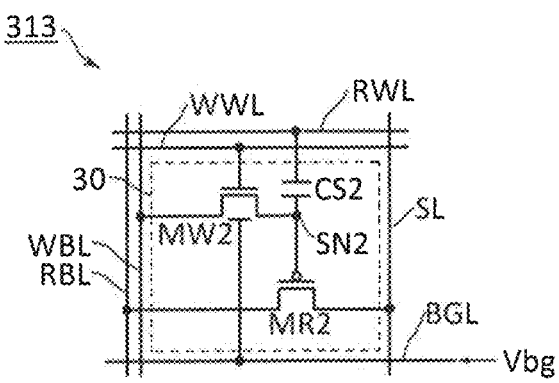
FIG. 9B is a circuit diagram showing a configuration example of a memory cell.

FIG. 9B shows a configuration example of the cell array 313. Typical components of the cell array 313 in one row and one column are shown in FIG. 9B. The memory cell 30 is a two-transistor gain cell, for example. The memory cell 30 includes a transistor MW2, a transistor MR2, a capacitor CS2, and a node SN2.

The node SN2 is a retention node. The capacitor CS2 is a capacitor for retaining the voltage of the node SN2. A first terminal and a second terminal of the capacitor CS2 are electrically connected to the node SN2 and the wiring RWL, respectively. The transistor MR2 is a p-channel Si transistor. The transistor MW2 is an OS transistor with a back gate. The back gate is electrically connected to the wiring BGL. The transistor MW2 and the capacitor CS2 can be stacked over the transistor MR2; therefore, the integration degree of the cell array 313 can be improved. The transistor MW2 can be an OS transistor with no back gate.

The voltage Vbg is input to the wiring BGL. The voltage Vbg is a voltage lower than the voltage Vss, e.g., a negative voltage. Since the voltage of the back gate can be a negative voltage, the threshold voltage of the transistor MW2 can be shifted to a positive voltage side.

FIGS. 10A to 10E show other configuration examples of the cell array. Each figure shows the configuration in one row and one column.

Figure 10A:
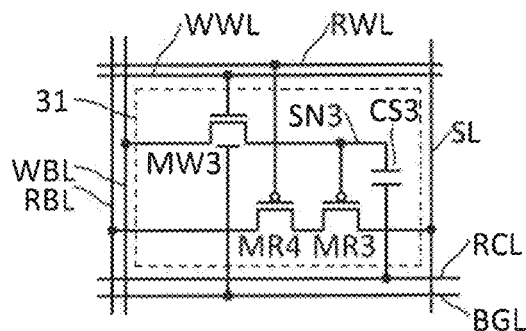
FIGS. 10A to 10E are circuit diagrams each illustrating a configuration example of a memory cell.

FIG. 10A shows a configuration example of a cell array with a three-transistor gain cell. A wiring RCL is provided for each row of the memory cell array in FIG. 10A. A memory cell 31 is electrically connected to the wirings WWL, RWL, WBL, RBL, SL, RCL, and BGL. The memory cell 31 includes transistors MW3, MR3, and MR4, a capacitor CS3, and a node SN3. The transistor MW2 is an OS transistor with a back gate. The back gate is electrically connected to the wiring BGL. The transistors MR4 and MR3 are p-channel Si transistors.

Figure 10B:
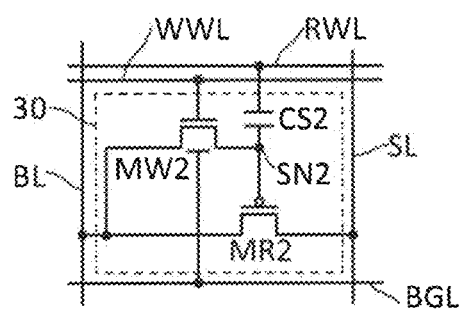
Figure 10C:
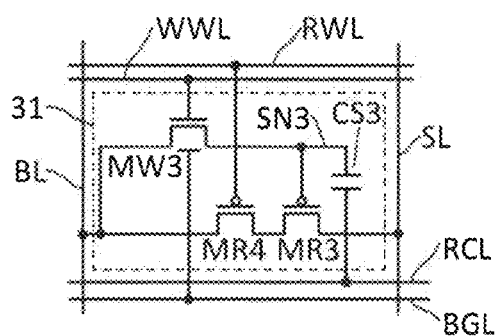

A cell array shown in FIG. 10B is a modification example of FIG. 9B, and a cell array shown in FIG. 10C is a modification example of FIG. 10A. In these cell arrays, a bit line for writing and reading (wiring BL) is provided instead of the wirings WBL and RBL.

Figure 10D:
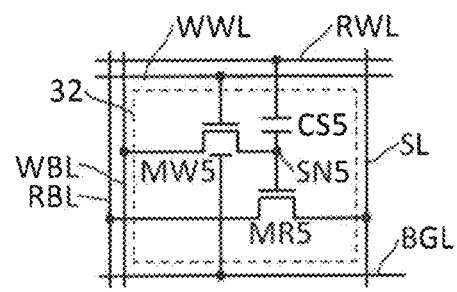

A cell array shown in FIG. 10D is a modification example of FIG. 9B. In FIG. 10D, in which an n-channel Si transistor is used instead of the transistor MR2. A memory cell 32 shown in FIG. 10D is electrically connected to the wirings WWL, RWL, WBL, RBL, SL, and BGL. The memory cell 32 includes transistors MW5 and MR5, a capacitor CS5, and a node SN5. The transistor MW5 is an OS transistor with a back gate. The transistors MR5 is an re-channel Si transistor. Also in the cell array in FIG. 10D, the wiring BL may be provided instead of the wirings WBL and RBL in a manner similar to that of FIG. 10B.

Figure 10E:
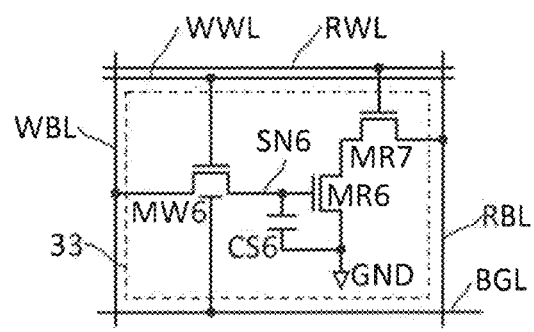

A cell array shown in FIG. 10E is a modification example of FIG. 10A, in which re-channel Si transistors are used instead of the transistors MR3 and MR4. A memory cell 33 shown in FIG. 10E is electrically connected to the wirings WWL, RWL, WBL, RBL, and BGL and a wiring to which a potential GND is input. The memory cell 33 includes transistors MW6, MR6, and MR7, a capacitor CS6, and a node SN6. The transistor MW6 is an OS transistor with a back gate. The transistors MR6 and MR7 are n-channel Si transistors. Also in the cell array in FIG. 10E, the wiring BL may be provided instead of the wirings WBL and RBL in a manner similar to that of FIG. 10C.

(Control Section 311)

The control section 311 is a logic circuit having a function of controlling the entire operation of the NOSRAM 300. The control section 311 has a function of generating the signal WAIT on the basis of the signals GW and WCY. Furthermore, the control section 311 has a function of performing a logic operation of the signals CE, GW, and BW and determining the operation mode and a function of generating a control signal for the driver section 312 so that the determined operation mode is executed.

(Driver Section 312 and Output Circuit 314)

The driver section 312 drives the wirings WWL, RWL, WBL, RBL, and SL of the cell array 313. Data is written/read to/from the cell array 313 by the driver section 312.

The data WDA[31:0] is input to the driver section 312 via the wiring GWBL. Data DO [31:0] read by the driver section 312 is output to the output circuit 314 via the wiring GRBL. The output circuit 314 has a function of retaining the data DO[31:0]. The output circuit 314 outputs the retained data to the outside of the NOSRAM 300. The output data is the data RDA[31:0].

The driver section 312 includes a row decoder 321, a read word line driver 322, a write word line driver 323, a column decoder 325, and a column driver 330.

The row decoder 321 has a function of decoding an address signal and a function of generating control signals for the read word line driver 322 and the write word line driver 323. The column decoder 325 has a function of decoding an address signal and a function of generating a control signal for the column driver 330.

The column driver 330 has a function of writing data to the cell array 313, a function of reading the data from the cell array 313, a function of amplifying the read data, a function of retaining the read data, and the like. More specifically, the column driver 330 has a function of controlling the voltages of the wirings WBL, RBL, and SL, for example. The column driver 330 shown in FIG. 9A includes a precharge circuit 331, a sense amplifier 332, an output multiplexer (MUX) 333, a write driver 334, and a source line driver 335.

The read word line driver 322 brings the memory cells 30 in a row which is specified by the row decoder 321 into a selection state. By the column driver 330, data is read out from the selected memory cells 30. The write word line driver 323 brings the memory cells 30 in a row which is specified by the row decoder 321 into a selection state. By the column driver 330, data is written to the selected memory cells 30.

<Configuration Example of Column Driver>

Figure 11:
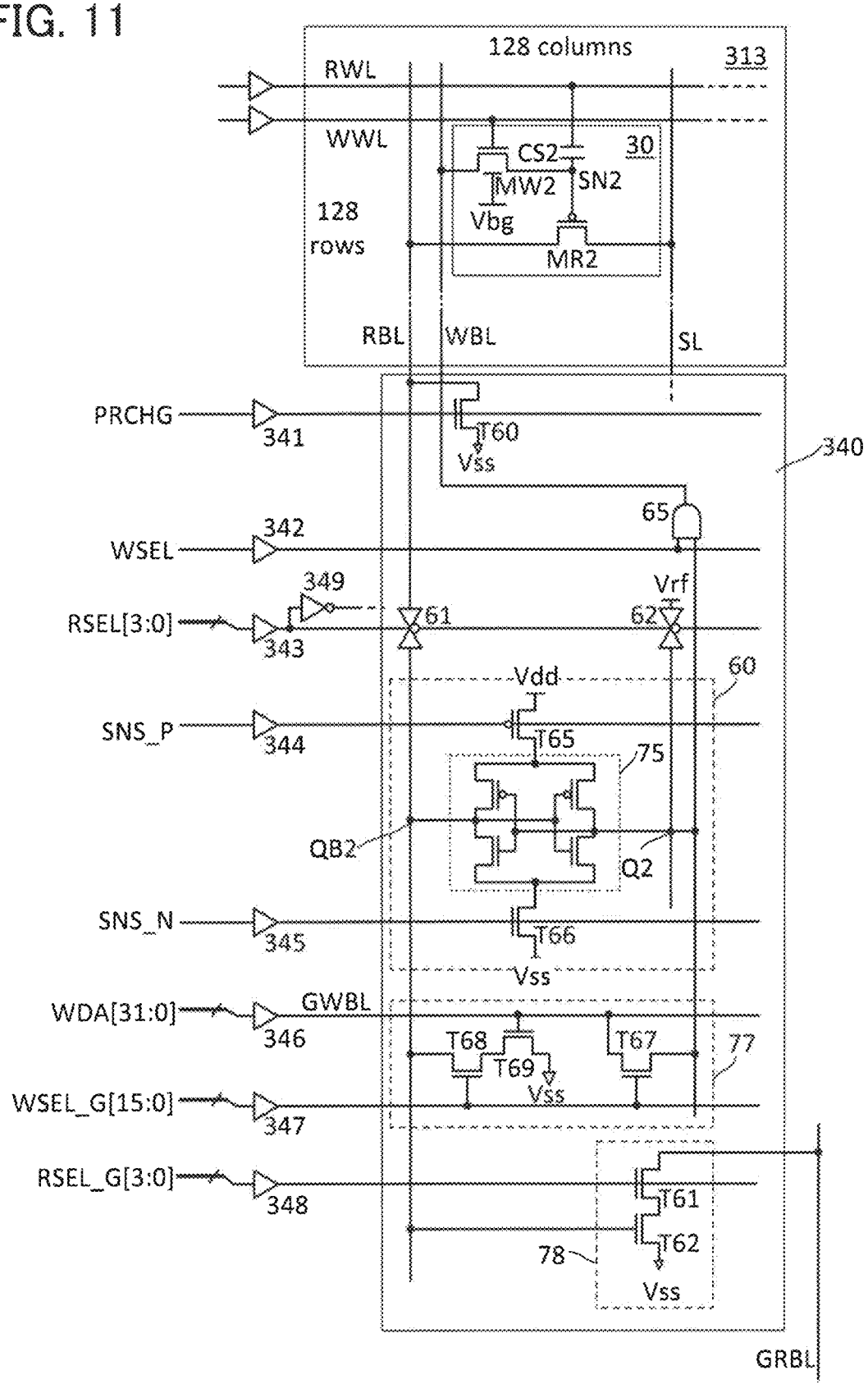
FIG. 11 is a circuit diagram showing a configuration example of a column driver.

A configuration example of the column driver 330 is described with reference to FIG. 11. A circuit 340 shown in FIG. 11 is a circuit block serving as a basic element of the column driver 330.

Signals PRCHG, SNS_P, SNS_N, RSEL[3:0], RSEL_G[3:0], WSEL, and WSEL_G[15:0] are control signals for the column driver 330 and are generated in the NOSRAM 300.

In the column driver 330, the circuit 340 is provided for each column. The circuit 340 includes transistors T60 to T62, transistors T65 to T69, a sense amplifier (SA) 60, transfer gates (TGs) 61 and 62, and an AND circuit 65. Note that elements included in the source line driver 335 are not illustrated in the circuit 340 shown in FIG. 11.

(Precharge Circuit 331)

The transistor T60 is provided in the precharge circuit 331. The signal PRCHG is input to a gate of the transistor T60 via a buffer 341. The transistor T60 is turned on, whereby the wiring RBL is precharged with the voltage Vss ("L").

(Sense Amplifier 332)

The SA 60 is provided in the sense amplifier 332. The SA 60 includes a latch circuit 75, the transistors T65 and T66, and nodes Q2 and QB2. The latch circuit 75 includes two inverter circuits.

The signal SNS_P is input to a gate of the transistor T65 via a buffer 344. The signal SNS_N is input to a gate of the transistor T66 via a buffer 345. The transistors T65 and T66 function as sleep transistors. The connection between the latch circuit 75 and a Vdd line (a wiring for supplying the voltage Vdd) is controlled by the transistor T65, and the connection between the latch circuit 75 and a Vss line (a wiring for supplying the voltage Vss) is controlled by the transistor T66. The logic of the signal SNS_P and the logic of the signal SNS_N change complementarily. Therefore, when the transistor T66 is on, the transistor T65 is also on.

(Output MUX 333)

The output MUX 333 has a function of selecting the wiring RBL from which data is to be read and a function of outputting the data of the wiring RBL to the wiring GRBL. In the NOSRAM 300, one wiring GRBL is provided for four wirings RBL.

The output MUX 333 is provided with the TGs 61 and 62 and the transistors T61 and T62. The signals RSEL[3:0] and RSEL_G[3:0] are control signals for the output MUX 333. The signals RSEL[3:0] are selection signals for selecting the wiring RBL from which data is to be read. The signals RSEL_G[3:0] are signals for controlling data output to the wiring GRBL.

The TG 61 controls the connection between the node QB2 and the wiring RBL. The TG 62 controls the connection between the node Q2 and a Vrf line (a wiring for supplying the voltage Vrf). Any one bit of the signals RSEL[3:0] is input to a gate of an n-channel transistor of TG 61 via a buffer 343 and input to a gate of a p-channel transistor thereof via the buffer 343 and an inverter 349. The same applies to the TG 62.

The transistors T61 and T62, which are connected in series, form a switch 78. Any one bit of the signals RSEL_G[3:0] is input to a gate of the transistor T61 via a buffer 348. A gate of the transistor T62 is electrically connected to the node QB2.

In the example of FIG. 11, four switches 78 are electrically connected in parallel to one wiring GRBL. The four switches 78 form a 4-input 1-output MUX. The 4-input 1-output MUX has a function of selecting one column from four columns in accordance with the signals RSEL_G[3:0] and outputting the data retained in the SA 60 of the selected column to the wiring GRBL.

<Write Driver>

The AND circuit 65 and the transistors T67 to T69 are provided in the write driver 334. The signals WSEL and WSEL_G[15:0] are control signals for the write driver 334. The write driver 334 has a function of selecting the wiring WBL to which data is to be written, a function of controlling input of write data to the column driver 330, and the like. One wiring GWBL is provided for four wirings WBL.

The signal WSEL is input to the AND circuit 65 via a buffer 342. The AND circuit 65 controls the connection between the node Q2 and the wiring WBL. The signals WSEL_G[15:0] are selection signals for selecting the wiring WBL to which data is to be written.

The transistors T67 to T69 form a circuit 77. The circuit 77 has a function of writing data of the wiring GWBL to the SA 60. Any one bit of the signals WSEL_G[15:0] is input to gates of the transistors T67 and T68 via a buffer 347. In addition, any one bit of the data WDA[31:0] is input to the wiring GWBL via a buffer 346. A gate of the transistor T69 is electrically connected to the wiring GWBL. When "H" is written to the wiring GWBL, the transistors T68 and T67 are turned on, so that data of "H" and data of "L" are written to the node Q2 and the node QB2, respectively.

The control section 311 performs a logical operation on the signals CE, GW, and BW[3:0] to determine the operation mode of the NOSRAM 300. Table 2 is a table of truth value for setting the operation mode of the NOSRAM 300. The NOSRAM 300 has a standby mode, a read mode, three write modes (a byte write mode, a half-word write mode, and a word write mode), and a refresh mode. The logic of signals RSEL[3:0], RSEL_G[3:0], and WSEL_G[15:0] is determined by the signals ADDR[10:2] and BW[3:0].

TABLE 2

| Mode | CE | GW | BW[0] | BW[1] | BW[2] | BW[3] |
|---|---|---|---|---|---|---|
| Standby | L | X | X | X | X | X |
| Read | H | L | L | L | L | L |
| Byte write | H | H | H | L | L | L |
| Half-word write | H | H | H | H | L | L |
| Word write | H | H | H | H | H | H |
| Refresh | H | H | L | L | L | L |

Here, the bit width of one word is 32 bits. The logic of signals BW[3], BW[2], BW[1], and BW[0] determines writing of data WDA[31:24], WDA[23:16], WDA[15:8], and WDA[7:0], respectively.

By configuration of the column driver 330 with the circuit 340 shown in FIG. 11, the NOSRAM 300 can execute data writing by unit smaller than the line size of the cell array 313 without adopting a hierarchical word line structure. This does not cause an increase in area due to a word line divider (AND circuit); therefore, the NOSRAM 300 is highly advantageous in increasing capacity. In addition, since the NOSRAM 300 does not include a word line divider, increase in the power consumption of the NOSRAM 300 due to increase in the capacity can be prevented.

The line size of the cell array 313 is 128 bits here. Writing in word units (e.g., 32 bits), writing in half-word units (e.g., 16 bits), and writing in byte units (e.g., 8 bits) are possible for the NOSRAM 300.

Note that the operation mode of the NOSRAM 300 is not limited to Table 2. For example, a control signal for selecting a burst mode may be input from the outside to perform burst writing and burst reading. An operation example of the NOSRAM 300 is described with reference to timing charts shown in FIG. 12 and FIG. 13.

Figure 12:
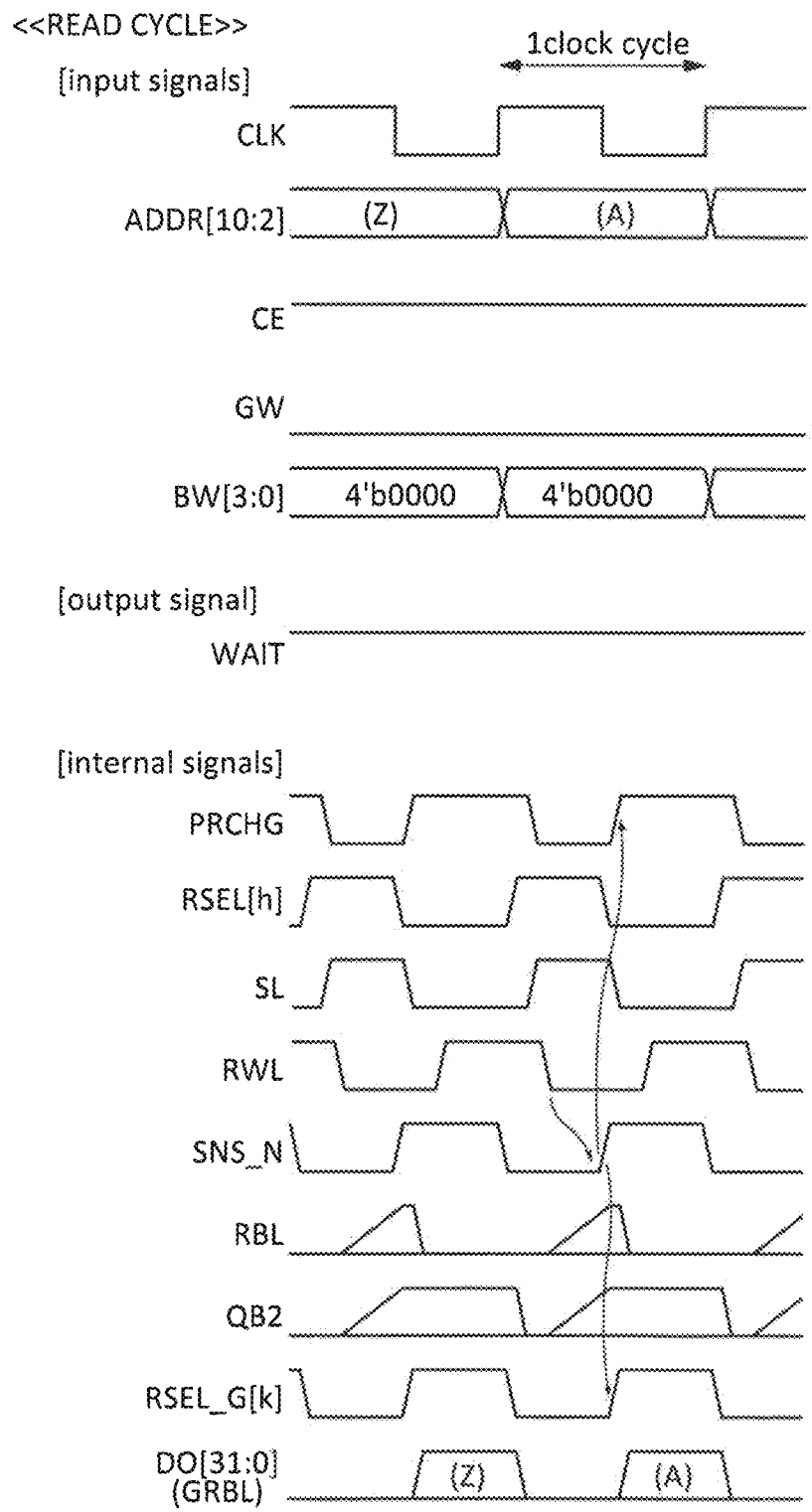
FIG. 12 is a timing chart showing an example of a read operation of a NOSRAM.
Figure 13:
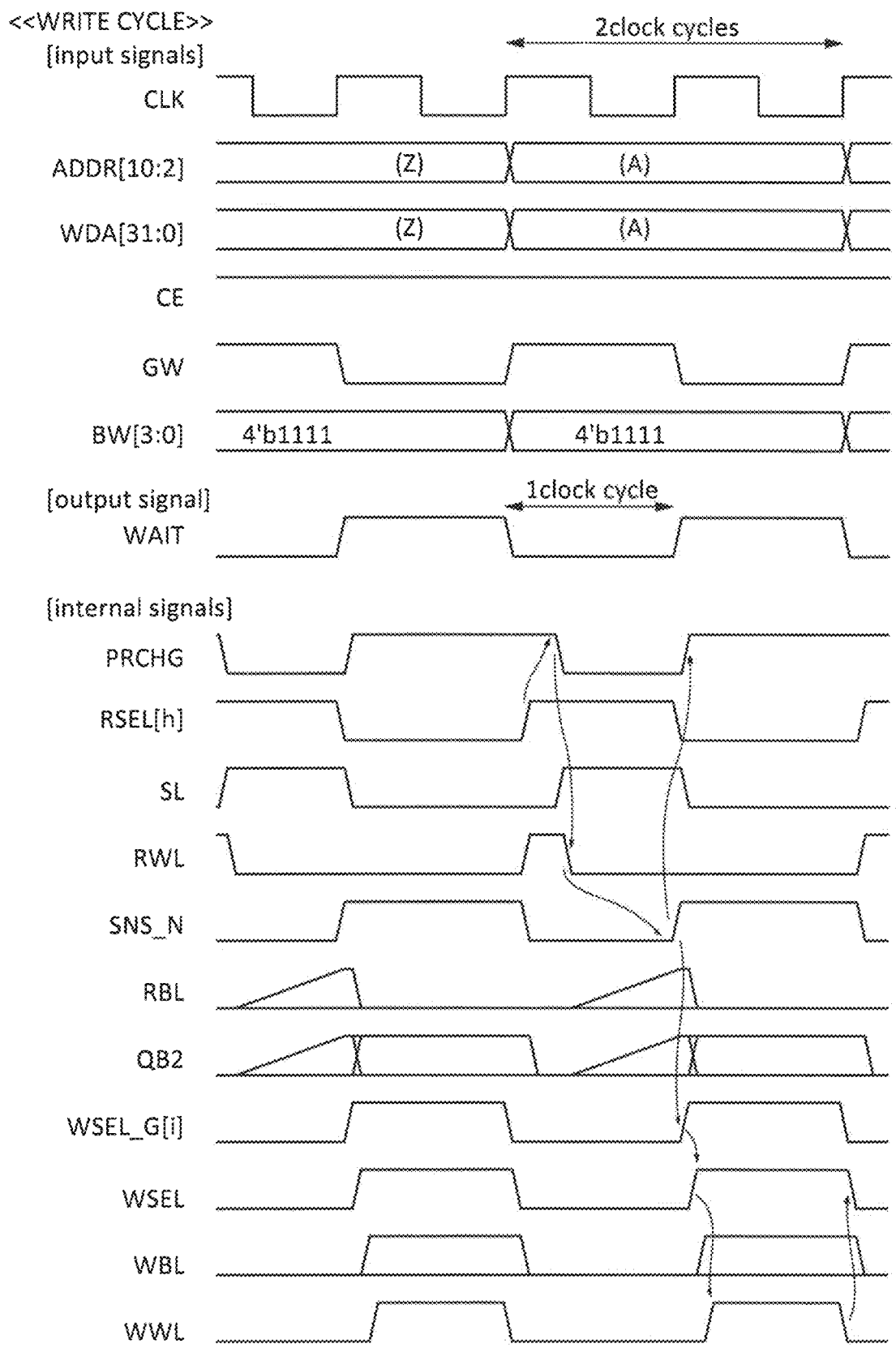
FIG. 13 is a timing chart showing an example of a write operation of a NOSRAM.

FIG. 12 is a timing chart showing an operation example of a read cycle of the NOSRAM 300, and FIG. 13 is a timing chart showing an operation example of a write cycle of the NOSRAM 300. In the timing charts, h of a signal RSEL[h] is an integer of 0 to 3, k of a signal RSEL_G[k] is an integer of 0 to 3, and i of a signal WSEL_G[i] is an integer of 0 to 15. For easy understanding of the operation of the NOSRAM 300, arrows are written in the timing charts.

Here, data of the signal WCY is 2'b01, and two clocks are assigned to the write cycle.

<Read Cycle>

In FIG. 12, an address (Z) or an address (A) is input, and data (Z) or data (A) is read from the memory cell 30 specified by the address. Here, the read cycle is described focusing on the address (A). For easy understanding of the operation of the NOSRAM 300, arrows are written in FIG. 12.

In the read cycle, the signal CE is 1'b1, the signal GW is 1'b0, and the signals BW[3:0] are 4'b0000 (Table 2). Therefore, the NOSRAM 300 outputs the signal WAIT of "H".

To read the data (A), the wiring RBL is precharged first. Since the signal SNS_N is at "L", supply of Vdd and Vss to the SAs 60 of all the columns is stopped. Since the signal PRCHG is at "H", the wiring RBL of each column is precharged to "L" by the transistor T60. The wirings RWL of all the rows are at "H", and thus all the memory cell 30 are not selected.

The address (A) is input, whereby the signals RSEL[3:0] becomes active. The signal SNS_N is maintained at "L". In each of the 32 read target columns, the node QB2 is connected to the wiring RBL by the TG 61 and the node Q2 is connected to the Vrf line by the TG 62. In each of the read target columns, the node QB2 is set to "L", and the node Q2 is supplied with the voltage Vrf.

Next, the signal PRCHG is set to "L", so that the precharge is completed. The memory cells 30 in the read target row are selected in conjunction with the completion of the precharge. First, the wirings SL of all the columns are set to "H". Next, the wiring RWL of the target row is set to "L". The voltage of the node SN2 is reduced in response to reduction in the potential of the wiring RWL. When the node SN2 retains data of "H", the transistor MR2 is kept in an off state, and the wiring RBL remains at "L". In the case where the node SN2 retains data of "L", the transistor MR2 is turned on, so that the voltage of the wiring RBL is increased. In each of the read target columns, the voltage of the node QB2 is changed in accordance with the voltage of the wiring RBL. That is, data whose logic is inverted from that of the node SN2 is output to the node QB2.

Next, the signal SNS_N is set to "H", whereby the SA 60 becomes active. The signals RSEL[3:0] are set to "L" to electrically disconnect the node QB2 from the wiring RBL. The SA 60 amplifies data written to the node QB2 and retains the amplified data. The node Q2 of the SA 60 retains data whose logic is the same as that of the node SN2.

Then, the signals RSEL_G[3:0] are activated. In each of the 32 read target columns, the transistor T61 is turned on. When the node QB2 is at "H", the wiring GRBL is at "L", whereas when the node QB2 is at "L", the wiring GRBL is at "H". That is, data whose logic is the same as that of data read from the node SN2 is written to the wiring GRBL. Thus, the data (A) is read out. The signals RSEL_G[3:0] remain active for a certain period. After that, the signals RSEL_G[3:0] are made to be inactive to terminate the read cycle.

Note that the precharge of the wiring RBL can be started as soon as data reading from the memory cell 30 is completed. In the example shown in FIG. 11, after the signals RSEL[3:0] are set to "L" to electrically disconnect the SA 60 from the wiring RBL, the signal PRCHG is set to "H" to start the precharge of the wiring RBL. Furthermore, the memory cell 30 in the target row is set in a non-selected state in conjunction with the start of the precharge. The wiring SL is set to "L" in conjunction with setting the signal PRCHG to "H", and then, the wiring RWL is set to "H".

The read cycle of the NOSRAM 300 is completed in one clock cycle; thus, the NOSRAM 300 can output the data (A) in the clock cycle in which the address (A) is received.

<Write Cycle>

In FIG. 13, the address (Z) or (A) is input, and data is written to the memory cell 30 specified by the address. A write cycle is described focusing on the address (A). Data is written by unit smaller than the line size of the cell array 313; thus, in the write cycle, a read operation is executed first, and then a write operation is executed.

The signal CE is 1'b1, the signal GW is 1'b1, and the signals BW[3:0] are 4'b1111. The signal WCY is 2'b01. Therefore, when the address (A) is input, the NOSRAM 300 outputs the signal WAIT of "L" for time for one clock cycle.

First, data of all of the memory cells 30 in the write target row is read out to the node QB2. This operation is similar to the operation in the read mode shown in FIG. 12. The signal SNS_N is set to "H", whereby data read out from the memory cells 30 is amplified and retained in the SA 60.

After the signal SNS_N is set to "H", the signal PRCHG is set to "H" to start precharge of the wiring RBL. The wiring SL is set to "L" in conjunction with the start of the precharge.

After the signal SNS_N is set to "H", the signals WSEL_G[15:0] are activated. In each of the 32 target columns, data (any one of WDA[31:0]) of the wiring GWBL is written to the node Q2 of the SA 60 by the circuit 77. The SAs 60 in the other columns retain the data which have been read out in advance.

Note that in the half-word write mode, one bit of any of WDA[15:0] is written to each of nodes Q2 in 16 target columns. In the byte write mode, one bit of any of WDA [7:0] is written to each of nodes Q2 in 8 target columns.

Next, the signal WSEL is set to "H". In each column, data whose logic is the same as that of the node Q2 is written to the wiring WBL by the AND circuit 65. Note that during a period when the signal WSEL is at "L", the wiring WBL remains at "L" by the AND circuit 65. Next, the wiring WWL in the target row is set to "H", and data of the wiring WBL is written to the memory cell 30. The data (A) is written to the memory cells 30 in the 32 target columns, and retained data is written back to the memory cells 30 in the other columns.

The wiring WWL is set to "L" so that the memory cell 30 in the write target row is set in a non-selected state. The signals WSEL_G[15:0] are set to be inactive so that the wiring GWBL and the SA 60 are electrically disconnected from each other. Then, the signal WSEL and the signal SNS_N are set to "L", and the wiring RWL is set to "H". Thus, the write cycle is terminated.

As described above, the NOSRAM 300 can write data in word units, half-word units, and byte units, but the unit of data writing is not limited thereto. The NOSRAM 300 can write data in appropriate units smaller than the line size of the cell array 313, e.g., in N-byte units (N is an integer greater than or equal to 1 and less than or equal to 8) by appropriately setting the circuit configuration of the driver section 312, the address signal, the control signal, and the like.

Although the capacity of the NOSRAM 300 is 2 KB here, one embodiment of the present invention is not limited thereto. Since a word line divider is not required in the NOSRAM 300, an increase in chip area and power consumption due to a word line divider does not occur; thus, the NOSRAM 300 has a circuit configuration that is highly effective in increasing capacity.

For example, unit blocks each of which includes the cell array 313 and the driver section 312 can be provided to increase the capacity of the NOSRAM 300.

Figure 14A:
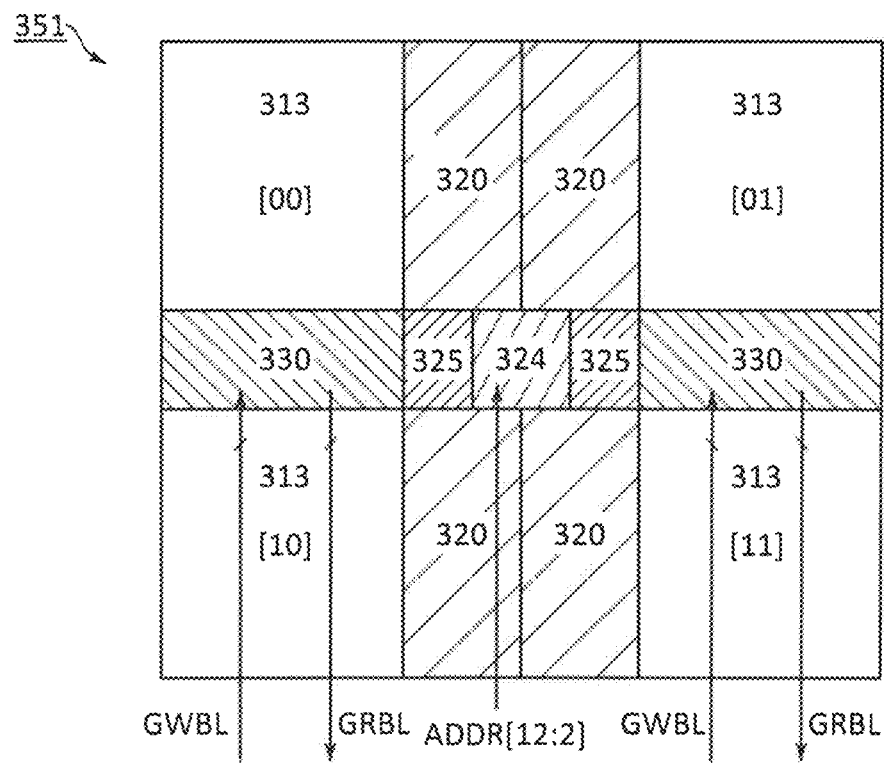
FIGS. 14A and 14B are block diagrams showing a configuration example of blocks in a NOSRAM.

For example, a block 351 shown in FIG. 14A has a capacity of 8 KB. The block 351 includes four cell arrays 313[00] to 313[11], four row drivers 320, one predecoder 324, two row decoders 325, and two column drivers 330. Each of the row drivers 320 includes the row decoder 321, the read word line driver 322, and the write word line driver 323. One of the two column drivers is shared by the cell arrays 313[00] and 313[10], and the other is shared by the cell arrays 313[01] and 313[11]. The predecoder 324 decodes ADDR[12:11] and identifies a cell array which is requested to be accessed, from the four cell arrays 313 [00] to 313[11]. Note that [00] or the like attached to each cell array 313 is the value of the addresses ADDR[12:11].

Figure 14B:
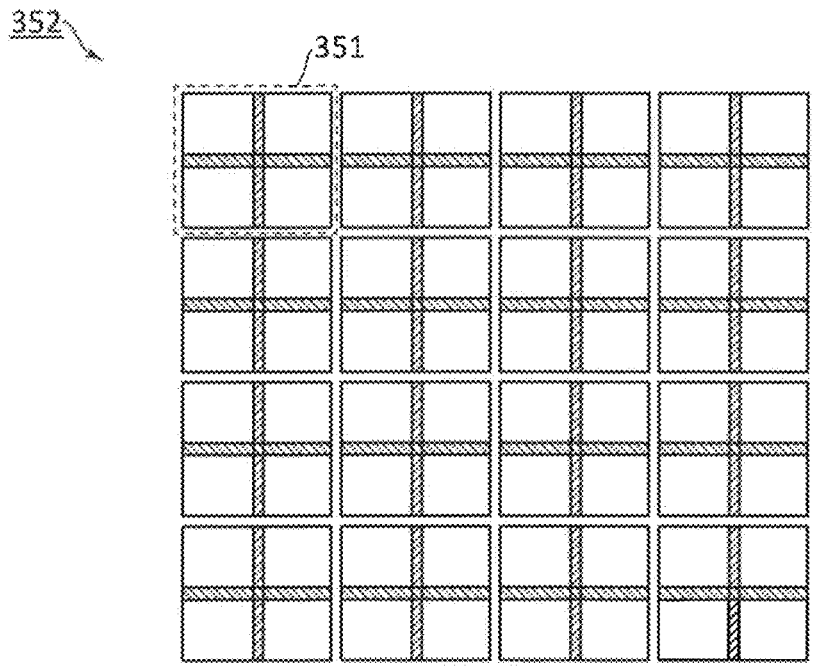

A block 352 shown in FIG. 14B includes 16 blocks 351 (arranged in a matrix of four rows and four columns). The capacity of the block 352 is 128 KB. Signals ADDR[16:2] are used as address signals. Signals ADDR[16:13] are used to select the block 351.

Embodiment 4

In this embodiment, an IC chip, an electronic component, an electronic device, and the like are described as examples of a semiconductor device.

<Example of Manufacturing Method of Electronic Component>

Figure 15A:
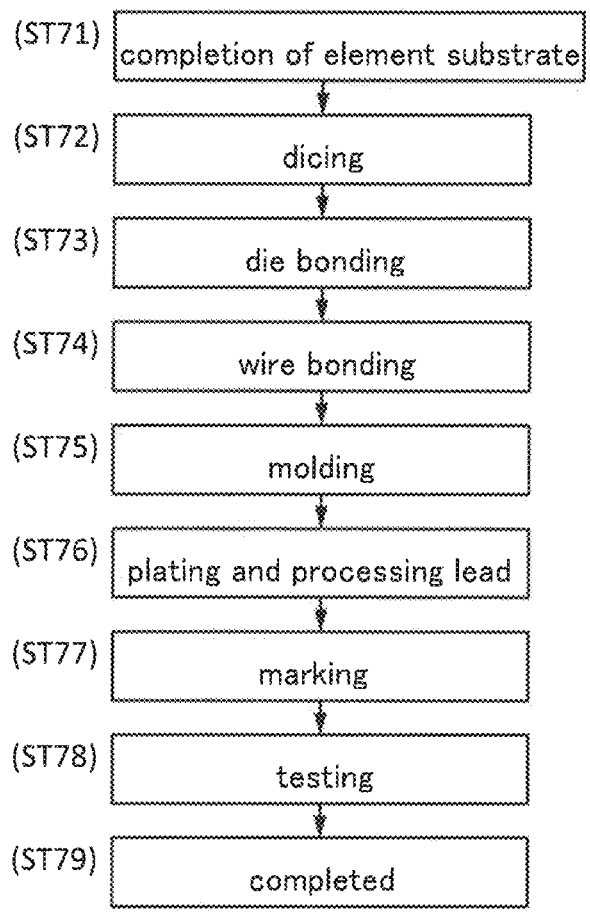
FIG. 15A is a flow chart showing an example of a method for manufacturing an electronic component.

FIG. 15A is a flow chart showing an example of a method for manufacturing an electronic component. The electronic component is also referred to as a semiconductor package or an IC package. The electronic component has a plurality of standards and names depending on a terminal extraction direction and a terminal shape. Thus, examples of the electronic component are described in this embodiment.

A semiconductor device including a transistor is completed by integrating detachable components on a printed board through the assembly process (post-process). The post-process can be completed through steps shown in FIG. 15A. Specifically, after an element substrate obtained in the pre-process is completed (Step ST71), a back surface of the substrate is ground. The substrate is thinned in this step to reduce warpage or the like of the substrate in the pre-process and to reduce the size of the component. Then, a dicing step of dividing the substrate into a plurality of chips is performed (Step ST72).

Figure 15B:
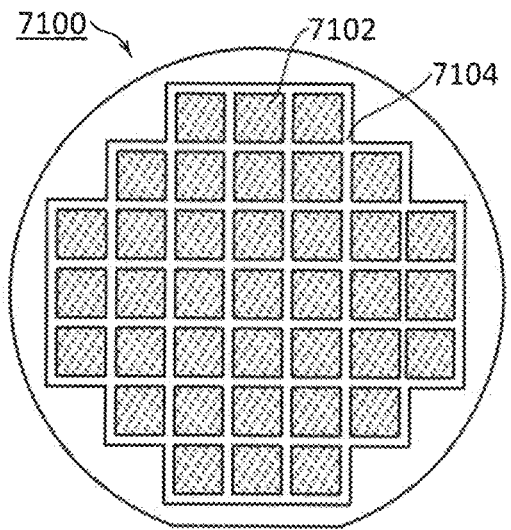
FIG. 15B is a top view of a semiconductor wafer.
Figure 15C:
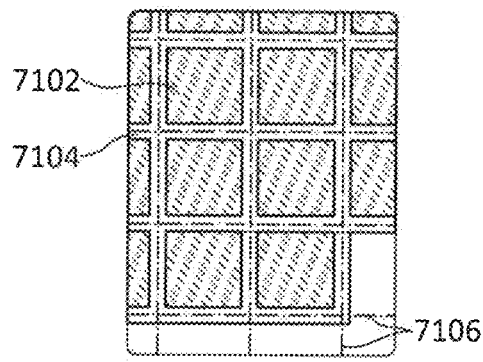
FIG. 15C is a partially enlarged view of the semiconductor wafer.

FIG. 15B is a top view of a semiconductor wafer 7100 on which a dicing process is not yet performed. FIG. 15C is a partially enlarged view of FIG. 15B. A plurality of circuit regions 7102 is provided on the semiconductor wafer 7100. A semiconductor device of one embodiment of the present invention (e.g., the MCU or the storage device) is provided in each circuit region 7102.

Figure 15D:
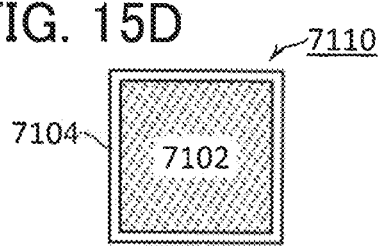
FIG. 15D is an enlarged view of a chip.

The circuit regions 7102 are each surrounded by a separation region 7104. Separation lines (also referred to as "dicing lines") 7106 are set at a position overlapping with the separation regions 7104. In the dicing step ST72, the semiconductor wafer 7100 is cut along the separation lines 7106, whereby chips 7110 including the circuit regions 7102 are cut out from the semiconductor wafer 7100. FIG. 15D is an enlarged view of the chip 7110.

A conductive layer or a semiconductor layer may be provided in the separation regions 7104. Providing a conductive layer or a semiconductor layer in the separation regions 7104 relieves ESD that might be caused in the dicing step, preventing a decrease in the yield due to the dicing step. A dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer or a semiconductor layer in the separation regions 7104 allows a reduction in the usage of the pure water. Therefore, the cost of manufacturing semiconductor devices can be reduced. Thus, semiconductor devices can be manufactured with improved productivity.

After Step ST72, the divided chips are separately picked up, placed on a lead frame, and bonded thereto in a die bonding step (Step ST73). In the die bonding step, the chip may be bonded to the lead frame by an appropriate method depending on the product, for example, with a resin or a tape. As the bonding method, a method suitable for the product may be selected; for example, the chips and the lead frame may be bonded with a resin or tape. In the die bonding step, the chip may be mounted on an interposer and bonded thereto. In a wire bonding step, a lead of the lead frame and an electrode on the chip are electrically connected to each other with a metal wire (Step ST74). A silver line or a gold line can be used as the metal wire. The wire bonding may be either ball bonding or wedge bonding.

A wire-bonded chip is subjected to a molding step of sealing the chip with an epoxy resin or the like (Step ST75). By the molding step, the inside of the electronic component is filled with a resin, thereby reducing damage to the circuit portion and the wire embedded in the component caused by external mechanical force as well as reducing deterioration of characteristics due to moisture or dust. The lead of the lead frame is plated. After that, the lead is cut and processed (Step ST76). The plating process prevents rust of the lead and facilitates soldering at the time of mounting the chip on a printed board in a later step. Next, printing process (marking) is performed on a surface of the package (Step ST77). After a testing step (Step ST78), the electronic component is completed (Step ST79). An electronic component including the semiconductor device described in the above embodiment can achieve low power consumption and a small size.

Figure 15E:
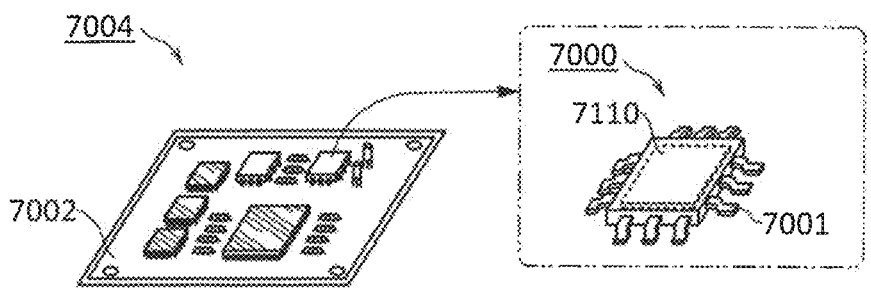
FIG. 15E is a schematic perspective view illustrating a structure example of the electronic component.

FIG. 15E shows a schematic perspective view of the completed electronic component. FIG. 15E shows a schematic perspective view of a quad flat package (QFP) as an example of the electronic component. As illustrated in FIG. 15E, an electronic component 7000 includes a lead 7001 and a chip 7110.

The electronic component 7000 is mounted on a printed board 7002, for example. A plurality of electronic components 7000 which are combined and electrically connected to each other over the printed board 7002 can be mounted on an electronic device. A completed circuit board 7004 is provided in an electronic device or the like. When an electronic device includes the electronic component 7000, the power consumption of the electronic device can be reduced. Alternatively, the electronic device can easily have a smaller size.

The electronic component 7000 can be used as an electronic component (IC chip) of electronic devices in a wide range of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Examples of such an electronic device include cameras (e.g., video cameras and digital still cameras), display devices, personal computers (PC), cellular phones, game machines including portable game machines, portable information terminals (e.g., smartphones and tablet information terminals), e-book readers, wearable information terminals (e.g., watch-type information terminals, head-mounted information terminals, goggle-type information terminals, glasses-type information terminals, armband-type information terminals, bracelet-type information terminals, and necklace-type information terminals), navigation systems, audio reproducing devices (e.g., car audio players and digital audio players), copiers, facsimiles, printers, multifunction printers, automated teller machines (ATM), vending machines, and consumer electronics.

Structure examples of electronic devices are described with reference to FIGS. 16A to 16F. A touch panel device including a touch sensor is preferably used in display portions of the electronic devices shown in FIG. 16A and the like. With the touch panel device, the display portion can also function as an input portion of the electronic device.

Figure 16A:
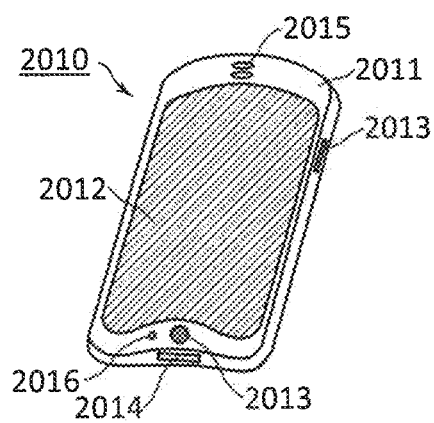
FIGS. 16A to 16F illustrate structure examples of an electronic device.

An information terminal 2010 illustrated in FIG. 16A includes a display portion 2012 incorporated into a housing 2011, an operation button 2013, an external connection port 2014, a speaker 2015, and a microphone 2016. Here, a display region of the display portion 2012 is curved. The information terminal 2010 is a portable information terminal driven with a battery and can be used as a tablet information terminal or a smartphone. The information terminal 2010 has functions such as phone calls, e-mailing, an appointment organizer, Internet communication, and music reproduction. Information can be input by touching the display portion 2012 with a finger or the like. Various kinds of operation such as making a call, inputting letters, and switching screen images on the display portion 2012 can be performed by touching the display portion 2012 with a finger or the like. The information terminal 2010 can be operated by inputting sound from the microphone 2016. Moreover, a variety of operations such as power on/off operation and screen switching of the display portion 2012 can be performed by pressing the operation button 2013.

Figure 16B:
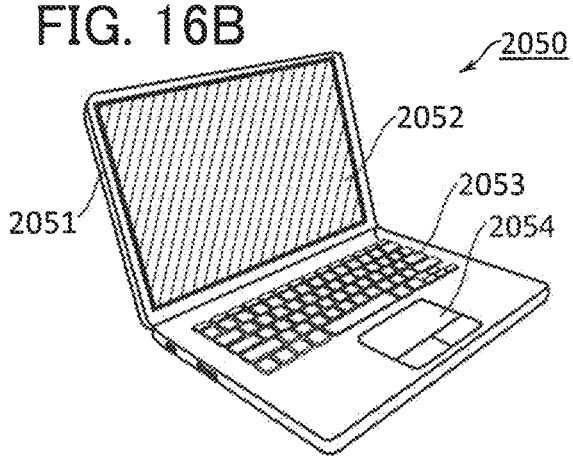

A laptop personal computer (PC) 2050 in FIG. 16B includes a housing 2051, a display portion 2052, a keyboard 2053, and a pointing device 2054. The laptop PC 2050 can be operated by touch operation on the display portion 2052.

Figure 16C:
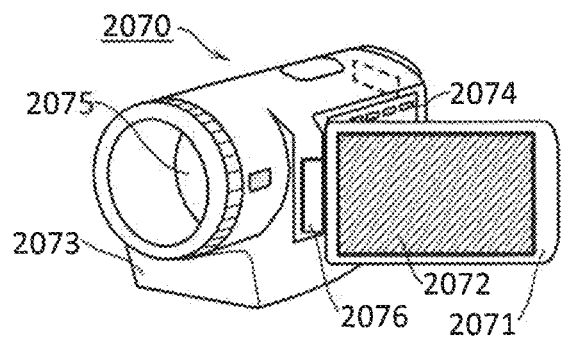

A video camera 2070 in FIG. 16C includes a housing 2071, a display portion 2072, a housing 2073, an operation key 2074, a lens 2075, and a joint 2076. The display portion 2072 is provided in the housing 2071. The operation key 2074 and the lens 2075 are provided in the housing 2073. The housing 2071 and the housing 2073 are connected to each other with the joint 2076, and the angle between the housing 2071 and the housing 2073 can be changed with the joint 2076. Images on the display portion 2072 may be switched in accordance with the angle between the housing 2071 and the housing 2073 at the joint 2076. A variety of operations such as start and stop of recording, zoom adjustment, and change of shooting range can be executed by touch operation on the display portion 2072.

Figure 16D:
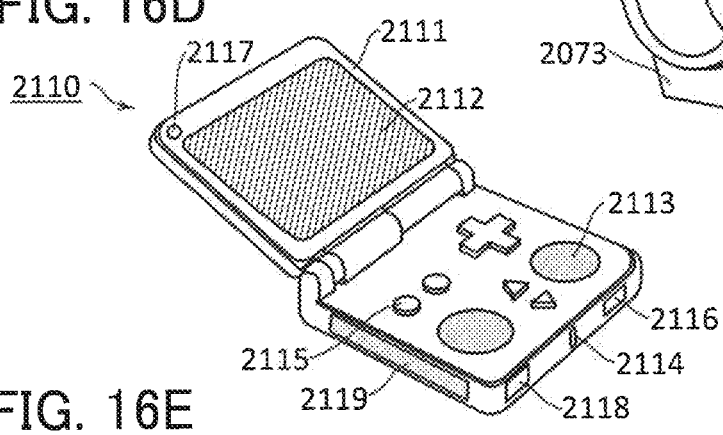

A portable game console 2110 in FIG. 16D includes a housing 2111, a display portion 2112, speakers 2113, an LED lamp 2114, operation key buttons 2115, a connection terminal 2116, a camera 2117, a microphone 2118, and a recording medium read portion 2119.

Figure 16E:
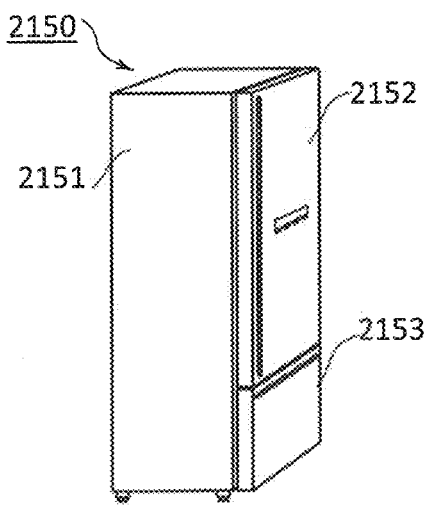

An electric refrigerator-freezer 2150 in FIG. 16E includes a housing 2151, a refrigerator door 2152, a freezer door 2153, and the like.

Figure 16F:
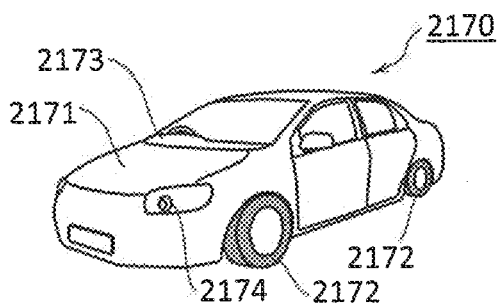

A motor vehicle 2170 in FIG. 16F includes a car body 2171, wheels 2172, a dashboard 2173, lights 2174, and the like. The processor described in Embodiment 3 is used as each of processors in the motor vehicle 2170.

Embodiment 5

In this embodiment, an oxide semiconductor transistor and the like are described.
<<Structure Example 1 of OS Transistor>>

FIG. 17A is a top view illustrating a structure example of an OS transistor. FIG. 17B is a cross-sectional view taken along line X1-X2 in FIG. 17A. FIG. 17C is a cross-sectional view taken along line Y1-Y2 in FIG. 17A. In some cases, the direction of line X1-X2 is referred to as a channel length direction, and the direction of line Y1-Y2 is referred to as a channel width direction. Accordingly, FIG. 17B illustrates a cross-sectional structure of the OS transistor in the channel length direction, and FIG. 17C illustrates a cross-sectional structure of the OS transistor in the channel width direction. Note that to clarify the device structure, FIG. 17A does not illustrate some components.

An OS transistor 501 is formed over an insulating surface, here, over an insulating layer 521. The OS transistor 501 is covered with insulating layers 528 and 529. The OS transistor 501 includes insulating layers 522 to 527, metal oxide layers 511 to 513, and conductive layers 550 to 553.

Note that an insulating layer, a metal oxide layer, a conductor, and the like in a drawing may have a single-layer structure or a stacked-layer structure. These layers can be formed by any of a variety of deposition methods such as a sputtering method, a molecular beam epitaxy (MBE) method, a pulsed laser deposition (PLD) method, a CVD method, and an atomic layer deposition (ALD) method. Examples of a CVD method include a plasma CVD method, a thermal CVD method, and a metal organic CVD method.

The metal oxide layers 511 to 513 are collectively referred to as an oxide layer 510. As illustrated in FIGS. 17B and 17C, the oxide layer 510 includes a portion where the metal oxide layer 511, the metal oxide layer 512, and the metal oxide layer 513 are stacked in that order. When the OS transistor 501 is on, a channel is mainly formed in the metal oxide layer 512 of the oxide layer 510.

A gate electrode of the OS transistor 501 is formed using the conductive layer 550. A pair of electrodes that functions as a source electrode and a drain electrode of the OS transistor 501 is formed using the conductive layers 551 and 552. A back gate electrode of the OS transistor 501 is formed using the conductive layer 553. The conductive layer 553 includes conductive layers 553a and 553b. Note that the OS transistor 501 does not necessarily include a back gate electrode. The same applies to OS transistors 502 to 507 to be described later.

A gate insulating layer on a gate (front gate) side is formed using the insulating layer 527. A gate insulating layer on a back gate side is formed using a stack of the insulating layers 524 to 526. The insulating layer 528 is an interlayer insulating layer. The insulating layer 529 is a barrier layer.

The metal oxide layer 513 covers a stack of the metal oxide layers 511 and 512 and the conductive layers 551 and 552. The insulating layer 527 covers the metal oxide layer 513. The conductive layers 551 and 552 each include a region that overlaps with the conductive layer 550 with the metal oxide layer 513 and the insulating layer 527 positioned therebetween.

The conductive layers 551 and 552 are formed using a hard mask used for forming the stack of the metal oxide layers 511 and 512. For example, the metal oxide layers 511 and 512 and the conductive layers 551 and 552 can be formed through the following steps. A two-layer metal oxide film is formed. A conductive film is formed over the metal oxide film. This conductive film is etched, so that a hard mask is formed. With the use of this hard mask, the two-layer metal oxide film is etched to form the stack of the metal oxide layers 511 and 512. Then, the hard mask is etched to form the conductive layers 551 and 552. Since the conductive layers 551 and 552 are formed through these steps, the conductive layers 551 and 552 do not include regions that are in contact with side surfaces of the metal oxide layers 511 and 512.

(Conductive Layer)

Examples of a conductive material used for the conductive layers 550 to 553 include a semiconductor typified by polycrystalline silicon doped with an impurity element such as phosphorus; silicide such as nickel silicide; a metal such as molybdenum, titanium, tantalum, tungsten, aluminum, copper, chromium, neodymium, or scandium; and a metal nitride containing any of the above metals as its component (tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

With the use of a conductive material with a high work function for the conductive layer 550, it is possible to increase Vt of the OS transistor 501 and reduce cutoff current. For the conductive layer 550, a conductive material whose work function is preferably higher than or equal to 4.8 eV, further preferably higher than or equal to 5.0 eV, still further preferably higher than or equal to 5.2 eV, yet further preferably higher than or equal to 5.4 eV, still further preferably higher than or equal to 5.6 eV can be used. Examples of the conductive material with a high work function include molybdenum, molybdenum oxide, Pt, Pt silicide, Ni silicide, indium tin oxide, and an In—Ga—Zn oxide to which nitrogen is added.

Note that the cutoff current refers to drain current at gate-source voltage=0 V.

For example, the conductive layer 550 is a single layer of tantalum nitride or tungsten. Alternatively, in the case where the conductive layer 550 has a two-layer structure or a three-layer structure, the following combinations can be used: aluminum and titanium; titanium nitride and titanium; titanium nitride and tungsten; tantalum nitride and tungsten; tungsten nitride and tungsten; titanium, aluminum, and titanium; titanium nitride, aluminum, and titanium; and titanium nitride, aluminum, and titanium nitride. The conductor written first is used for a layer on the insulating layer 527 side.

The conductive layers 551 and 552 have the same layer structure. For example, in the case where the conductive layer 551 is a single layer, any of metals such as aluminum, titanium, chromium, nickel, copper, yttrium, zirconium, molybdenum, silver, tantalum, and tungsten, or an alloy containing any of these metals as its main component may be used. Alternatively, in the case where the conductive layer 551 has a two-layer structure or a three-layer structure layer, the following combinations can be used: titanium and aluminum; tungsten and aluminum; tungsten and copper; a copper-magnesium-aluminum alloy and copper; titanium and copper; titanium or titanium nitride, aluminum or copper, and titanium or titanium nitride; and molybdenum or molybdenum nitride, aluminum or copper, and molybdenum or molybdenum nitride. The conductor written first is used for a layer on the insulating layer 527 side.

For example, it is preferable that the conductive layer 553a be a conductive layer that has a hydrogen barrier property (e.g., a tantalum nitride layer) and that the conductive layer 553b be a conductive layer that has higher conductivity than the conductive layer 553a (e.g., a tungsten layer). With such a structure, the conductive layer 553 functions as a wiring and has a function of preventing diffusion of hydrogen into the oxide layer 510.

(Insulator)

Examples of insulating materials used for the insulating layers 521 to 529 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 521 to 529 are formed using a single-layer structure or a stacked-layer structure of these insulating materials. The layers used for the insulating layers 521 to 529 may include a plurality of insulating materials.

Note that in this specification and the like, an oxynitride refers to a compound that contains more oxygen than nitrogen, and a nitride oxide refers to a compound that contains more nitrogen than oxygen.

In order to suppress the increase in oxygen vacancies in the oxide layer 510, the insulating layers 526 to 528 preferably include oxygen. Further preferably, at least one of the insulating layers 526 to 528 is formed using an insulating film from which oxygen is released by heating (hereinafter such an insulating film is referred to as an insulating film containing excess oxygen). When oxygen is supplied from the insulating film containing excess oxygen to the oxide layer 510, the oxygen vacancies in the oxide layer 510 can be compensated. Thus, reliability and electrical characteristics of the OS transistor 501 can be improved.

The insulating film containing excess oxygen is a film from which oxygen molecules at more than or equal to $1.0 \times 10^{18}$ molecules/cm$^3$ are released in thermal desorption spectroscopy (TDS) at a surface temperature of the film of higher than or equal to 100° C. and lower than or equal to 700° C., or higher than or equal to 100° C. and lower than or equal to 500° C. The amount of released oxygen molecules is preferably more than or equal to $3.0 \times 10^{20}$ molecules/cm$^3$.

The insulating film containing excess oxygen can be formed by performing treatment for adding oxygen to an insulating film. The treatment for adding oxygen can be performed by heat treatment in an oxygen atmosphere, ion implantation, ion doping, plasma immersion ion implantation, plasma treatment, or the like. As a gas for adding oxygen, an oxygen gas of $^{16}O_2$, $^{18}O_2$, or the like, a nitrous oxide gas, an ozone gas, or the like can be used.

The concentration of hydrogen in the insulating layers 521 to 529 is preferably low in order to prevent the increase in the concentration of hydrogen in the oxide layer 510. In particular, the concentration of hydrogen in the insulating layers 523 to 528 is preferably low. Specifically, the concentration of hydrogen is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$.

The concentration of nitrogen in the insulating layers 523 to 528 is preferably low in order to prevent the increase in the concentration of nitrogen in the oxide layer 510. Specifically, the concentration of nitrogen is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

The hydrogen concentration and the nitrogen concentration are measured by secondary ion mass spectrometry (SIMS).

In the OS transistor 501, the oxide layer 510 is preferably surrounded by an insulating layer with oxygen and hydrogen barrier properties (hereinafter such an insulating layer is referred to as a barrier layer). With such a structure, it is possible to suppress the release of oxygen from the oxide layer 510 and entry of hydrogen into the oxide layer 510; thus, the reliability and electrical characteristics of the OS transistor 501 can be improved.

For example, the insulating layer 529 functions as a barrier layer and at least one of the insulating layers 521, 522, and 524 functions as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride.

In addition, a barrier layer may be provided between the oxide layer 510 and the conductive layer 550. Alternatively, a metal oxide layer that has oxygen and hydrogen barrier properties may be provided as the metal oxide layer 513.

The film thicknesses of the insulating layer 524, the insulating layer 525, and the insulating layer 526 are preferably reduced so that the threshold voltage of the OS transistor can be easily controlled with the voltage of the conductive layer 550. For example, the film thicknesses of the insulating layers 524 to 526 are each smaller than or equal to 50 nm. The film thicknesses of the insulating layers 524 to 526 are each preferably smaller than or equal to 30 nm, further preferably smaller than or equal to 10 nm, still further preferably smaller than or equal to 5 nm.

A structure example of the insulating layers 521 to 529 is described. In this example, each of the insulating layers 521, 522, 525, and 529 functions as a barrier layer. The insulating layers 526 to 528 are oxide layers containing excess oxygen. The insulating layer 521 is formed using silicon nitride. The insulating layer 522 is formed using aluminum oxide. The insulating layer 523 is formed using silicon oxynitride. The gate insulating layers (524 to 526) on the back gate side are formed using a stack of silicon oxide, aluminum oxide, and silicon oxide. The gate insulating layer (527) on the front gate side is formed using silicon oxynitride. The interlayer insulating layer (528) is formed using silicon oxide. The insulating layer 529 is formed using aluminum oxide.

(Metal Oxide Layer)

The thickness of each of the metal oxide layers 511 to 513 is larger than or equal to 3 nm and smaller than or equal to 500 nm, preferably larger than or equal to 3 nm and smaller than or equal to 100 nm, further preferably larger than or equal to 3 nm and smaller than or equal to 60 nm.

In order to reduce the off-state current of the OS transistor 501, for example, the energy gap of the metal oxide layer 512 is preferably large. The energy gap of the metal oxide layer 512 is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

The oxide layer 510 is preferably a crystalline metal oxide layer, where at least the metal oxide layer 512 is preferably a crystalline metal oxide layer. The OS transistor 501 can have high reliability and favorable electrical characteristics.

As the oxide of the metal oxide layer 512, typically, an In—Ga oxide, an In—Zn oxide, or an In-M-Zn oxide (M is Al, Ga, Y, or Sn) can be used. The metal oxide layer 512 is not limited to the oxide layer containing indium. The metal oxide layer 512 can be formed using a Zn—Sn oxide, a Ga—Sn oxide, or a Zn—Mg oxide, for example. The metal oxide layers 511 and 513 can be formed using an oxide that is similar to the oxide of the metal oxide layer 512. The metal oxide layers 511 and 513 can be formed using a Ga oxide. In that case, the metal oxide layer 512 is preferably a metal oxide layer containing Ga.

When an interface level is formed at an interface between the metal oxide layer 512 and the metal oxide layer 511, a channel region is also formed in a region close to the interface; thus, the threshold voltage of the OS transistor 501 varies. It is preferable that the metal oxide layer 511 contain at least one of the metal elements contained in the metal oxide layer 512.

Accordingly, an interface state is hardly formed at the interface between the metal oxide layer 512 and the metal oxide layer 511, and variations in the electrical characteristics of the OS transistor 501, such as the threshold voltage, can be reduced.

The metal oxide layer 513 preferably contains at least one of the metal elements contained in the metal oxide layer 512 because interface scattering is unlikely to occur at the interface between the metal oxide layer 512 and the metal oxide layer 513, and carrier transfer is not inhibited. Thus, the field-effect mobility of the OS transistor 501 can be increased.

It is preferable that the metal oxide layer 512 have the highest carrier mobility among the metal oxide layers 511 to 513. Accordingly, a channel can be formed in the metal oxide layer 512 that is apart from the insulating layers 526 and 527.

For example, in a metal oxide containing In such as an In-M-Zn oxide, carrier mobility can be increased by an increase in the In content. In the In-M-Zn oxide, the s orbital of heavy metal mainly contributes to carrier transfer, and when the indium content is increased, overlaps of the s orbitals of In atoms are increased; therefore, an oxide having a high content of indium has higher mobility than an oxide having a low content of indium. Therefore, an oxide having a high content of indium is used as an oxide semiconductor film, so that carrier mobility can be increased.

For example, the metal oxide layer 512 is formed using an In—Ga—Zn oxide, and the metal oxide layers 511 and 513 are formed using a Ga oxide. For example, in the case where the metal oxide layers 511 to 513 are formed using an In-M-Zn oxide, the metal oxide layer 511 is formed to have the highest In content among the metal oxide layers 511 to 513. In the case where the In-M-Zn oxide is formed by sputtering, the In content can be changed by a change in the atomic ratio of metal elements of a target.

For example, it is preferable that the atomic ratio of metal elements of a target used for depositing the metal oxide layer 512 be In:M:Zn=1:1:1, 3:1:2, or 4:2:4.1. For example, it is preferable that the atomic ratio of metal elements of a target used for depositing the metal oxide layers 511 and 513 be In:M:Zn=1:3:2 or 1:3:4. The atomic ratio of an In-M-Zn oxide deposited using a target of In:M:Zn=4:2:4.1 is approximately In:M:Zn=4:2:3.

In order that the OS transistor 501 have stable electrical characteristics, it is preferable to reduce the concentration of impurities in the oxide layer 510. In the metal oxide, hydrogen, nitrogen, carbon, silicon, and a metal element other than a main component are impurities. For example, hydrogen and nitrogen form donor levels to increase the carrier density, and silicon and carbon form impurity levels in the oxide semiconductor. The impurity levels serve as traps and might cause deterioration in the electric characteristics of the transistor.

For example, the oxide layer 510 includes a region where the concentration of silicon is lower than or equal to $2 \times 10^{18}$ atoms/cm$^3$, preferably lower than or equal to $2 \times 10^{17}$ atoms/cm$^3$. The same applies to the concentration of carbon in the oxide layer 510.

The oxide layer 510 includes a region where the concentration of alkali metal is lower than or equal to $1 \times 10^{18}$ atoms/cm$^3$, preferably lower than or equal to $2 \times 10^{16}$ atoms/cm$^3$. The same applies to the concentration of alkaline earth metal.

The oxide layer 510 includes a region where the concentration of nitrogen is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

The oxide layer 510 includes a region where the concentration of hydrogen is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

The above-described concentrations of the impurities in the oxide layer 510 are measured by SIMS.

In the case where the metal oxide layer 512 contains oxygen vacancies, donor levels are formed by entry of hydrogen into sites of oxygen vacancies in some cases. As a result, the on-state current of the OS transistor 501 is decreased. Sites of oxygen vacancies become more stable by entry of oxygen than by entry of hydrogen. Thus, by decreasing oxygen vacancies in metal oxide layer 512, the on-state current of the OS transistor 501 can be increased in some cases. Consequently, preventing entry of hydrogen into sites of oxygen vacancies by a reduction in hydrogen in the metal oxide layer 512 is effective in improving on-state current characteristics.

Hydrogen contained in a metal oxide reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, the OS transistor 501 is likely to be normally-on when the metal oxide layer 512 contains hydrogen because the metal oxide layer 512 includes a channel formation region. Accordingly, it is preferable that hydrogen in the metal oxide layer 512 be reduced as much as possible.

FIGS. 17A to 17C illustrate examples in which the oxide layer 510 has a three-layer structure; however, one embodiment of the present invention is not limited thereto. For example, the oxide layer 510 may have a two-layer structure without the metal oxide layer 511 or 513. Alternatively, the oxide layer 510 may have a four-layer structure in which any one of the oxide semiconductor layers described as the metal oxide layers 511 to 513 is provided below or over the metal oxide layer 511 or below or over the metal oxide layer 513. Alternatively, the oxide layer 510 may include one or more metal oxide layers that are similar to the metal oxide layers 511 to 513 at two or more of the following positions: between given layers in the oxide layer 510, over the oxide layer 510, and below the oxide layer 510.

(Energy Band Structure)

Figure 24:
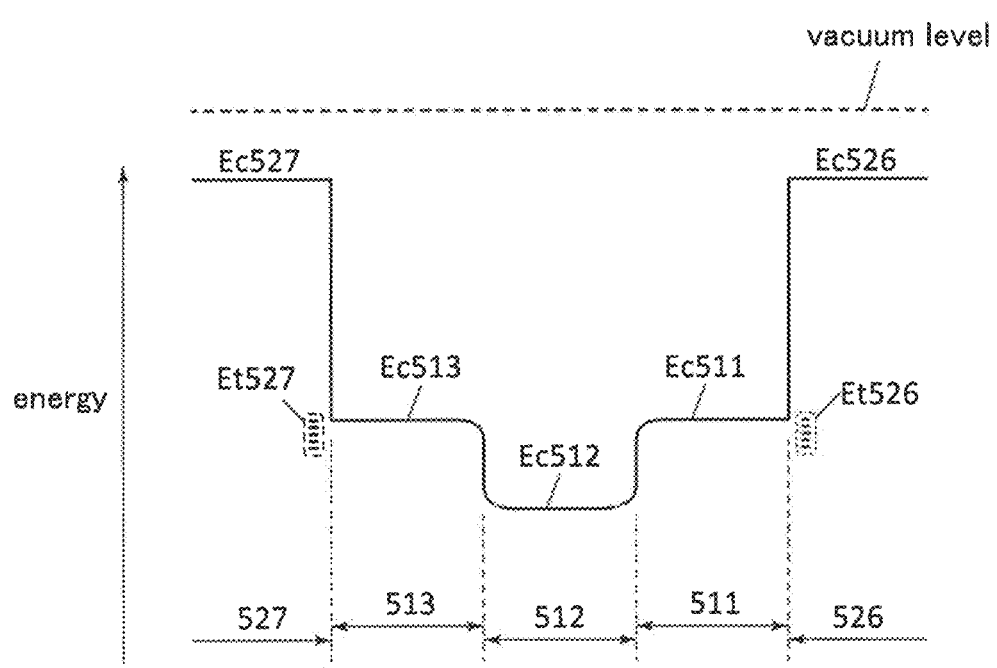
FIG. 24 is an energy band diagram of an OS transistor.

Effects of the stack of the metal oxide layers 511 to 513 are described with reference to FIG. 24. FIG. 24 is a schematic diagram showing the energy band structure of a channel formation region of the OS transistor 501. Although the OS transistor 501 is described here as an example, effects of the stack of the metal oxide layers 511 to 513 in the OS transistors 502 and 503 to be described later are similar to those in the OS transistor 501.

Here, Ec526, Ec511, Ec512, Ec513, and Ec527 indicate the energy at the conduction band minimum of the insulating layer 526, the metal oxide layer 511, the metal oxide layer 512, the metal oxide layer 513, and the insulating layer 527, respectively.

Here, a difference in energy between the vacuum level and the conduction band minimum (the difference is also referred to as electron affinity) corresponds to a value obtained by subtracting an energy gap from a difference in energy between the vacuum level and the valence band maximum (the difference is also referred to as an ionization potential). The energy gap can be measured using a spectroscopic ellipsometer (UT-300 manufactured by HORIBA JOBIN YVON S.A.S.). The difference in energy between the vacuum level and the valence band maximum can be measured using an ultraviolet photoelectron spectroscopy (UPS) device (VersaProbe manufactured by ULVAC-PHI, Inc.).

Since the insulating layers 526 and 527 are insulators, Ec526 and Ec527 are closer to the vacuum level than Ec511, Ec512, and Ec513 (i.e., the insulating layers 526 and 527 have lower electron affinities than the metal oxide layers 511 to 513).

The metal oxide layer 512 has a higher electron affinity than the metal oxide layers 511 and 513. For example, the difference in electron affinity between the metal oxide layers 511 and 512 and the difference in electron affinity between the metal oxide layers 512 and 513 are each greater than or equal to 0.07 eV and less than or equal to 1.3 eV. The difference in electron affinity between the metal oxide layers 511 and 512 and the difference in electron affinity between the metal oxide layers 512 and 513 are each preferably greater than or equal to 0.1 eV and less than or equal to 0.7 eV, further preferably greater than or equal to 0.15 eV and less than or equal to 0.4 eV. Note that the electron affinity is a difference in energy between the vacuum level and the conduction band minimum.

When voltage is applied to the gate electrode (the conductive layer 550) of the OS transistor 501, a channel is mainly formed in the metal oxide layer 512 having the highest electron affinity among the metal oxide layers 511 to 513.

An indium gallium oxide has low electron affinity and a high oxygen-blocking property. Therefore, the metal oxide layer 513 preferably includes an indium gallium oxide. The gallium atomic ratio [Ga/(In+Ga)] is, for example, higher than or equal to 70%, preferably higher than or equal to 80%, further preferably higher than or equal to 90%.

In some cases, there is a mixed region of the metal oxide layers 511 and 512 between the metal oxide layers 511 and 512. Furthermore, in some cases, there is a mixed region of the metal oxide layers 512 and 513 between the metal oxide layers 512 and 513. Because the mixed region has low interface state density, a stack of the metal oxide layers 511 to 513 (the oxide layer 510) has a band structure where energy at each interface and in the vicinity of the interface is changed continuously (continuous junction).

Electrons transfer mainly through the metal oxide layer 512 in the oxide layer 510 having such an energy band structure. Therefore, even when an interface state exists at an interface between the metal oxide layer 511 and the insulating layer 526 or an interface between the metal oxide layer 513 and the insulating layer 527, electron movement in the oxide layer 510 is less likely to be inhibited and the on-state current of the OS transistor 501 can be increased.

Although trap states Et526 and Et527 due to impurities or defects might be formed in the vicinity of the interface between the metal oxide layer 511 and the insulating layer 526 and the vicinity of the interface between the metal oxide layer 513 and the insulating layer 527 as illustrated in FIG. 24, the metal oxide layer 512 can be separated from the trap states Et526 and Et527 owing to the existence of the metal oxide layers 511 and 513.

Note that when a difference between Ec511 and Ec512 is small, an electron in the metal oxide layer 512 might reach the trap state Et526 by passing over the difference in energy. Since the electron is trapped at the trap state Et526, negative fixed charge is generated at the interface with the insulating film, causing the threshold voltage of the transistor to be shifted in a positive direction. The same applies to the case where a difference between Ec512 and Ec513 is small.

Each of the difference between Ec511 and Ec512 and the difference between Ec512 and Ec513 is preferably greater than or equal to 0.1 eV, further preferably greater than or equal to 0.15 eV so that a change in the threshold voltage of the OS transistor 501 can be reduced and the OS transistor 501 can have favorable electrical characteristics.

<<Structure Example 2 of OS Transistor>>

The OS transistor 502 in FIGS. 18A to 18C is a modification example of the OS transistor 501. The conductive layer 550 of the OS transistor 502 includes a conductive layer 550a, a conductive layer 550b, and a conductive layer 550c.

The conductive layer 550a is preferably formed by a thermal CVD method, an MOCVD method, or an ALD method. In particular, the conductive layer 550a is preferably formed by an ALD method. When the conductive layer 550a is formed by an ALD method or the like, plasma damage to the insulating layer 527 can be reduced. In addition, the conductive layer 550a is preferably formed by ALD or the like because coverage thereof can be improved. Therefore, it is possible to provide the highly reliable OS transistor 502.

The conductive layer 550b is formed using a material that has high conductivity, such as tantalum, tungsten, copper, or aluminum. The conductive layer 550c formed over the conductive layer 550b is preferably formed using a conductor that is unlikely to be oxidized, such as tungsten nitride. In the case where an oxide material from which oxygen is released is used for the insulating layer 528, the conductive layer 550 can be prevented from being oxidized by released oxygen. Thus, it is possible to suppress oxidation of the conductive layer 550 and efficiently supply oxygen released from the insulating layer 528 to the oxide layer 510.

When a conductor that is unlikely to be oxidized is used for the conductive layer 550c having a large contact area with the insulating layer 528 including an excess oxygen region, it is possible to suppress absorption of excess oxygen in the insulating layer 528 by the conductive layer 550. In addition, when a conductor with high conductivity is used for the conductive layer 550b, it is possible to provide the OS transistor 502 with low power consumption.

<<Structure Example 3 of OS Transistor>>

The OS transistor 503 in FIGS. 19A to 19C is a modification example of the OS transistor 501. In the OS transistor 503, the conductive layer 550 is used as an etching mask to etch the metal oxide layer 513 and the insulating layer 527.

<<Structure Example 4 of OS Transistor>>

Figure 20A:
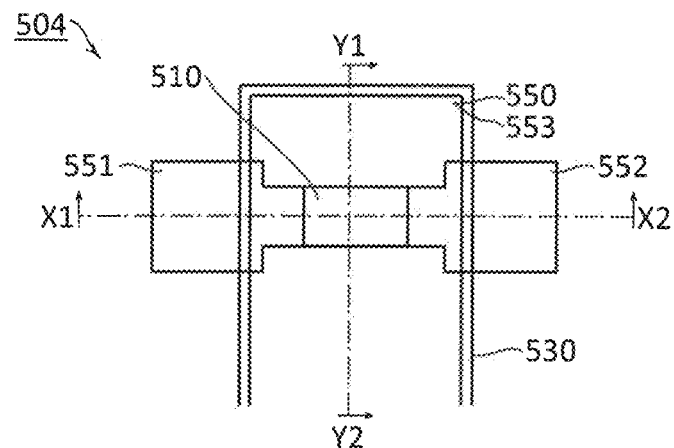
FIG. 20A is a plan view illustrating a structure example of an OS transistor.
Figures 20B, 20C:
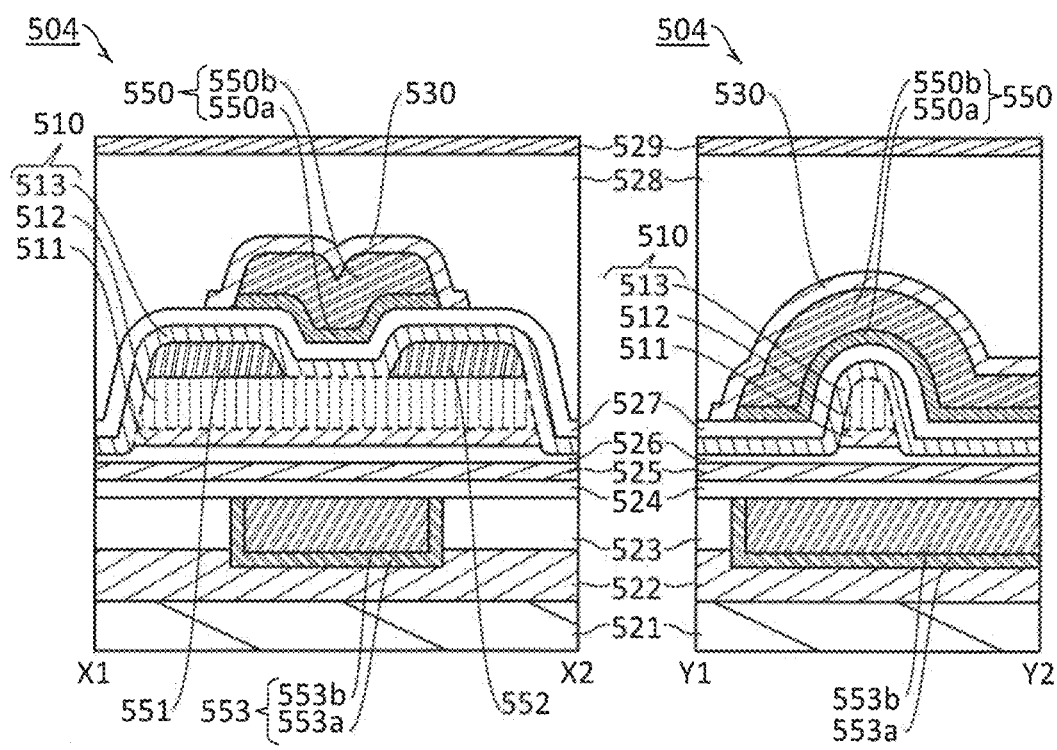
FIGS. 20B and 20C are cross-sectional views of the OS transistor in FIG. 20A.

The OS transistor 504 in FIGS. 20A to 20C is a modification example of the OS transistor 501.

The conductive layer 550 has a two-layer structure of the conductive layer 550a and the conductive layer 550b. The conductive layer 550 is covered with an insulating layer 530.

For example, the insulating layer 530 has an oxygen barrier property. Thus, oxygen released from the insulating layer 528 or the like can suppress oxidation of the conductive layer 550. In that case, a metal oxide such as aluminum oxide can be used for the insulating layer 530. The thickness of the insulating layer 530 is not limited to a certain thickness as long as oxidation of the conductive layer 550 can be prevented. For example, the thickness of the insulating layer 530 is greater than or equal to 1 nm and less than or equal to 10 nm, preferably greater than or equal to 3 nm and less than or equal to 7 nm.

Note that as in the case of the OS transistor 503, the metal oxide layer 513 and the insulating layer 527 in the OS transistor 504 may be partly removed so that upper surfaces of the conductive layers 551 and 552 are partly exposed. Alternatively, only the insulating layer 527 may be partly removed.

<<Structure Example 5 of OS Transistor>>

The OS transistor 505 in FIGS. 21A to 21C is a modification example of the OS transistor 501.

The conductive layer 551 has a two-layer structure of a conductive layer 551a and a conductive layer 551b, and the conductive layer 552 has a two-layer structure of a conductive layer 552a and a conductive layer 552b.

In the conductive layers 551 and 552, the conductive layers 551a and 552a are preferably formed using a conductive film that has high adhesion to the metal oxide layer 512. This conductive film is preferably formed by an ALD method because coverage thereof can be improved. The conductive layers 551b and 552b are preferably formed using a conductor that has higher conductivity than the conductive layers 551a and 552a. The use of the conductive layers 551a and 552a reduces restrictions on a conductive material that can be used for the conductive layers 551b and 552b. When a material that has high conductivity, such as tantalum, tungsten, copper, or aluminum, is used for the conductive layers 551a and 552a, power consumption of a circuit including the OS transistor 505 can be reduced.

<<Structure Example 6 of OS Transistor>>

The OS transistor 506 in FIGS. 22A to 22C is a modification example of the OS transistor 501. The OS transistor 506 differs from the OS transistor 501 mainly in the structure of the gate electrode.

The metal oxide layer 513, the insulating layer 527, and the conductive layer 550 are provided in an opening portion formed in the insulating layer 528. In other words, a gate electrode can be formed in a self-aligned manner by using the opening portion of the insulating layer 528. Thus, in the OS transistor 506, a gate electrode (550) does not include a region that overlaps with a source electrode or a drain electrode (551 or 552) with a gate insulating layer (527) positioned therebetween. Accordingly, gate-source parasitic capacitance and gate-drain parasitic capacitance can be reduced and frequency characteristics can be improved. Furthermore, the gate electrode width can be controlled by the opening portion of the insulating layer 528; thus, it is easy to fabricate an OS transistor with a short channel length.

<<Structure Example 7 of OS Transistor>>

The OS transistor 507 in FIGS. 23A to 23C is a modification example of the OS transistor 506.

The oxide layer 510 further includes a metal oxide layer 514. The metal oxide layer 514 covers the metal oxide layers 511 and 512 and the conductive layers 551 and 552.

The metal oxide layer 512 is separated from the insulating layer 528 by the metal oxide layer 514. In the oxide layer 510, a channel is mainly formed in the metal oxide layer 512; thus, generation of a shallow level in the vicinity of the channel can be suppressed when there is no region where the metal oxide layer 512 is in contact with the insulating layer 528. Thus, reliability of the OS transistor 507 can be improved.

<<Structure Example 3 of Semiconductor Device>>

Structure examples of a semiconductor device including an OS transistor and a Si transistor are described with reference to FIG. 25 and FIG. 26.

Figure 25:
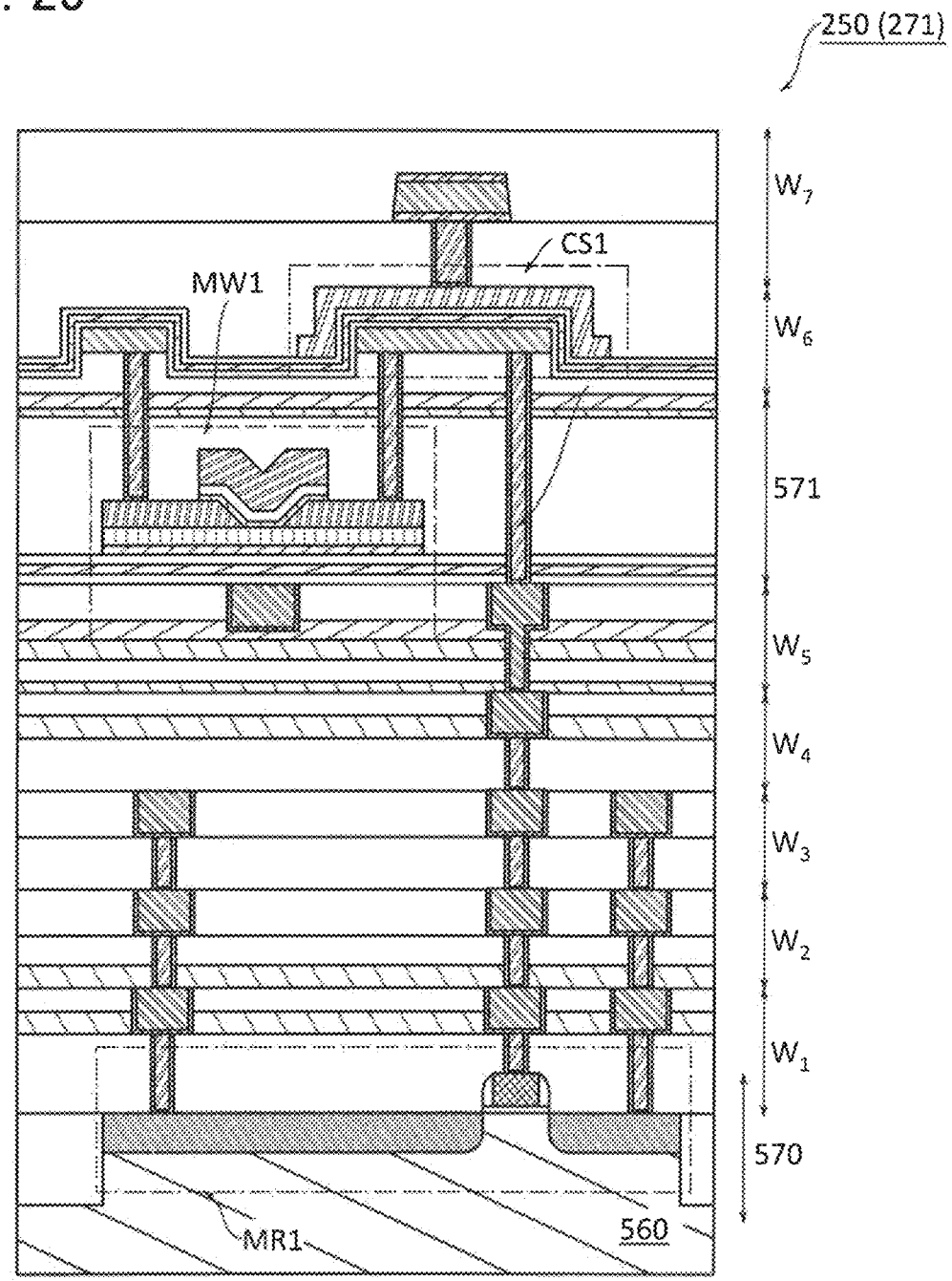
FIG. 25 is a cross-sectional view illustrating a structural example of an MCU.
Figure 26:
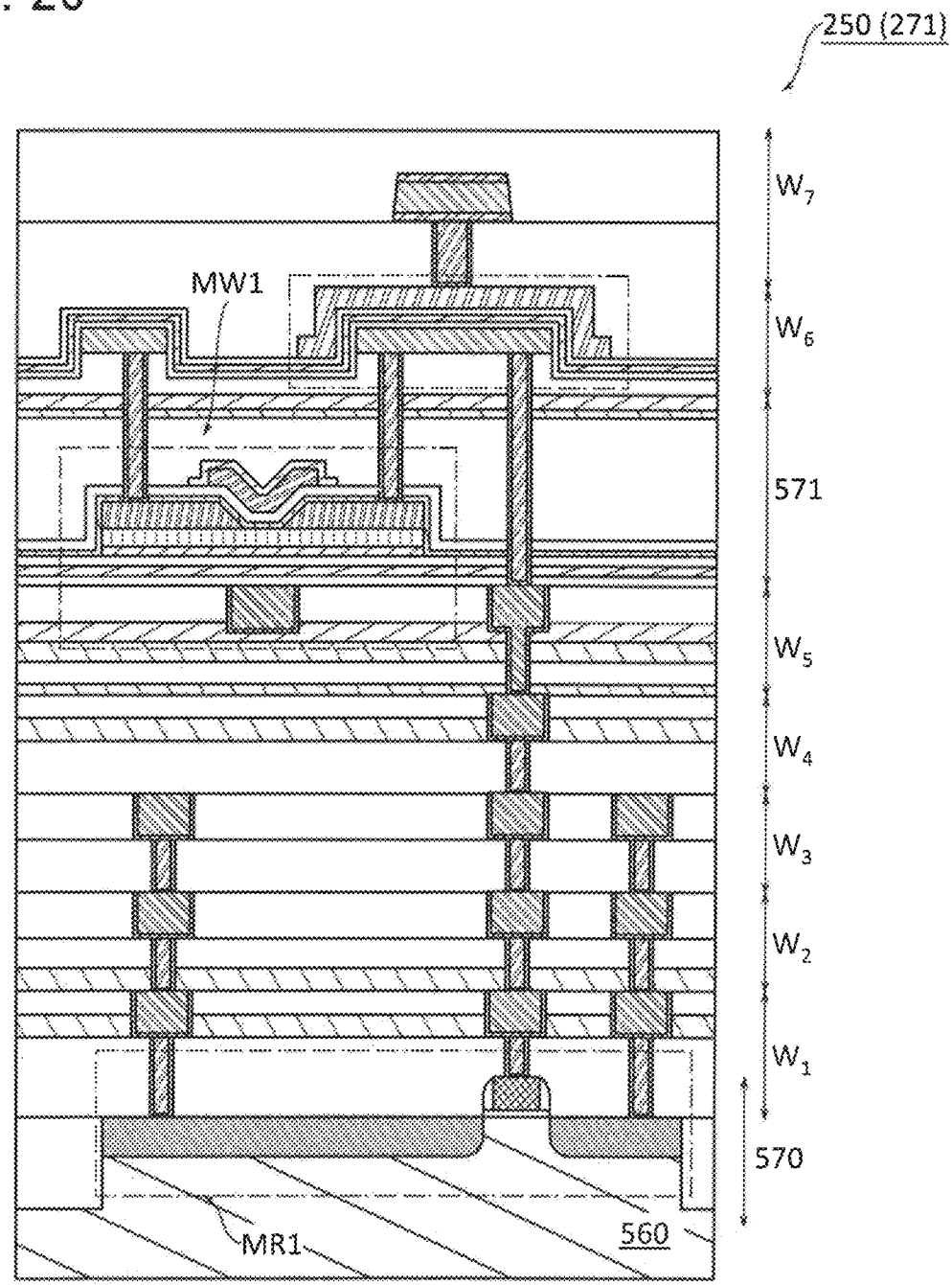
FIG. 26 is a cross-sectional view illustrating a structural example of an MCU.

FIG. 25 and FIG. 26 are each a cross-sectional view for describing the stacked-layer structure of the MCU 100 (FIG. 1). FIG. 25 shows a main part of the NOSRAM 120 mounted on the MCU 100.

The MCU 100 is formed of a structure in which a CMOS layer 570, wiring layers $W_1$ to $W_5$, an OS FET layer 571, and wiring layers $W_6$ and $W_7$ are stacked.

A Si transistor included in the MCU 100 is provided in the CMOS layer 570. An active layer of the Si transistor is formed using a single crystalline silicon wafer 560.

An OS transistor of the MCU 100 is provided in the OS FET layer 571. An OS transistor of the memory cell 135 of the NOSRAM 120 is provided in the OS FET layer 571. The memory cell 135 is shown in FIG. 25. Note that in FIG. 25, the transistor MW1 is an OS transistor with a back gate and has a structure similar to that of the OS transistor 503 (FIGS. 19A to 19C). The back gate of the transistor is formed in the wiring layer $W_5$. The capacitor CS1 is provided in the wiring layer $W_6$.

FIG. 26 shows an example in which a transistor with a structure similar to that of the OS transistor 504 (FIGS. 20A to 20C) is provided in the OS FET layer 571. FIG. 26 shows a main part of the MCU 100, in a manner similar to that of FIG. 25.

Embodiment 6

In this embodiment, an oxide semiconductor is described. An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

(CAAC-OS)

A CAAC-OS is an oxide semiconductor having a plurality of c-axis aligned crystal parts (also referred to as pellets).

The CAAC-OS has c-axis alignment, its crystal parts (nanocrystals) are connected in an a-b plane direction, and the crystal structure has distortion. The size of the crystal part is greater than or equal to 1 nm, or greater than or equal to 3 nm. For this reason, the crystal part of the CAAC-OS can be referred to as a nanocrystal, and the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

The impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, oxygen vacancies in the oxide semiconductor serve as carrier traps or serve as carrier generation sources when hydrogen is captured therein.

(nc-OS)

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS. Thus, the orientation of the whole film is not observed. Since there is no regularity of crystal orientation between the crystal parts (nanocrystals), the nc-OS can also be referred to as an oxide semiconductor including random aligned nanocrystals (RANC) or an oxide semiconductor including non-aligned nanocrystals (NANC).

Since the crystal of the nc-OS does not have alignment, the nc-OS cannot be distinguished from an a-like OS or an amorphous oxide semiconductor in some cases depending on an analysis method.

The a-like OS has lower density than the nc-OS and the CAAC-OS. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor whose density is lower than 78% of the density of the single crystal oxide semiconductor.

For example, in the case of an oxide semiconductor with an atomic ratio of In:Ga:Zn=1:1:1, the density of single-crystal $InGaZnO_4$ with a rhombohedral crystal structure is 6.357 $g/cm^3$. Thus, for example, in the case of the oxide semiconductor with an atomic ratio of In:Ga:Zn=1:1:1, the density of an a-like OS is higher than or equal to 5.0 $g/cm^3$ and lower than 5.9 $g/cm^3$. In addition, for example, in the case of the oxide semiconductor with an atomic ratio of In:Ga:Zn=1:1:1, the density of an nc-OS or a CAAC-OS is higher than or equal to 5.9 $g/cm^3$ and lower than 6.3 $g/cm^3$.

Note that in the case where single crystals with the same composition do not exist, by combining single crystals with different compositions at a given proportion, it is possible to estimate density that corresponds to the density of a single crystal with a desired composition. The density of the single crystal with a desired composition may be estimated using weighted average with respect to the combination ratio of the single crystals with different compositions. Note that it is preferable to combine as few kinds of single crystals as possible for density estimation.

As described above, oxide semiconductors have various structures and various properties. An oxide semiconductor may be a stacked film including two or more of an amorphous oxide semiconductor, an a-like OS, an nc-OS, and a CAAC-OS, for example. The structure of the oxide semiconductor can be identified by X-ray diffraction (XRD), nanobeam electron diffraction, observation with a transmission electron microscope (TEM), or the like.

<Carrier Density of Oxide Semiconductor>

Next, the carrier density of an oxide semiconductor is described. Examples of a factor affecting the carrier density of an oxide semiconductor include oxygen vacancy ($V_O$) and impurities in the oxide semiconductor.

As the amount of oxygen vacancy in the oxide semiconductor increases, the density of defect states increases when hydrogen is bonded to the oxygen vacancy (this state is also referred to as $V_O H$). The density of defect states also increases with an increase in the amount of impurity in the oxide semiconductor. Hence, the carrier density of an oxide semiconductor can be controlled by controlling the density of defect states in the oxide semiconductor.

The carrier density of the oxide semiconductor is preferably reduced in order to inhibit the negative shift of Vt of the OS transistor or reduce the off-state current of the OS transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state.

The carrier density of the oxide semiconductor is preferably increased in some cases in order to increase the on-state current or field-effect mobility of the OS transistor. The carrier density of the oxide semiconductor can be increased by slightly increasing the impurity concentration or the density of defect states in the oxide semiconductor. For example, an oxide semiconductor that has a slightly high impurity concentration or a slightly high density of defect states in the range where a favorable ratio between the on-state current and the off-state current (i.e., Ion/Ioff ratio) of the OS transistor is obtained can be regarded as being substantially intrinsic.

Furthermore, an oxide semiconductor that has high electron affinity and thus has a narrow bandgap so as to increase the density of thermally excited electrons (carriers) can be regarded as substantially intrinsic. Note that an OS transistor using an oxide semiconductor with higher electron affinity has lower Vt.

The oxide semiconductor with an increased carrier density has somewhat n-type conductivity; thus, it can be referred to as a "slightly-n" oxide semiconductor.

The carrier density of a highly purified intrinsic oxide semiconductor is, for example, lower than $8 \times 10^{15}$ $cm^{-3}$, preferably lower than $1 \times 10^{11}$ $cm^{-3}$, further preferably lower than $1 \times 10^{10}$ $cm^{-3}$ and higher than or equal to $1 \times 10^{-9}$ $cm^{-3}$.

The carrier density of a substantially highly purified intrinsic oxide semiconductor is, for example, higher than or equal to $1 \times 10^5$ $cm^{-3}$ and lower than $1 \times 10^{18}$ $cm^{-3}$, preferably higher than or equal to $1 \times 10^7$ $cm^{-3}$ and lower than or equal to $1 \times 10^{17}$ $cm^{-3}$, more preferably higher than or equal to $1 \times 10^9$ $cm^{-3}$ and lower than or equal to $5 \times 10^{16}$ $cm^{-3}$, still more preferably higher than or equal to $1 \times 10^{10}$ $cm^{-3}$ and lower than or equal to $1\times10^{16}$ cm$^{-3}$, yet more preferably higher than or equal to $1\times10^{11}$ cm$^{-3}$ and lower than or equal to $1\times10^{15}$ cm$^{-3}$.

EXPLANATION OF REFERENCE

30, 31, 32, and 33: memory cell; 60: sense amplifier (SA), 61 and 62: transfer gate (TG), 65: AND circuit, 75: latch circuit, 77: circuit, 78: switch, 100 and 102: MCU (microcontroller unit), 110 and 150: bus, 111 and 151: processor core, 112 and 152: memory section, 115 and 155: clock generation circuit, 116 and 156: peripheral circuit, 120 and 170: NOSRAM, 121 and 171: memory, 131 and 181: control section, 132 and 182: driver section, 133 and 183: cell array, 135 and 185: memory cell, 161: configuration register, 162: clock generator, 163: logic section, 300: NOSRAM, 311: control section, 312: driver section, 313: cell array, 314: output circuit, 320: row driver, 321: row decoder, 322: read word line driver, 323: write word line driver, 324: predecoder, 325: column decoder, 330: column driver, 331: precharge circuit, 332: sense amplifier, 333: output MUX (multiplexer), 334: write driver, 335: source line driver, 340: circuit, 341, 342, 343, 344, 345, 346, 347, and 348: buffer, 349: inverter, 351 and 352: block, 501, 502, 503, 504, 505, 506, and 507: OS transistor, 510: oxide layer, 511, 512, 513, and 514: metal oxide layer, 521, 522, 523, 524, 525, 526, 527, 528, 529, and 530: insulating layer, 550, 550*a*, 550*b*, 550*c*, 551, 551*a*, 551*b*, 552, 552*a*, 552*b*, 553, 553*a*, and 553*b*: conductive layer, 560: single crystalline silicon wafer, 570: CMOS layer, 571: OS FET layer, 2010: information terminal, 2011: housing, 2012: display portion, 2013: operation button, 2014: external connection port, 2015: speaker, 2016: microphone, 2050: laptop personal computer (PC), 2051: housing, 2052: display portion, 2053: keyboard, 2054: pointing device, 2070: video camera, 2071: housing, 2072: display portion, 2073: housing, 2074: operation key, 2075: lens, 2076: joint, 2110: portable game console, 2111: housing, 2112: display portion, 2113: speaker, 2114: LED lamp, 2115: operation key button, 2116: connection terminal, 2117: camera, 2118: microphone, 2119: recording medium read portion, 2150: electric refrigerator-freezer, 2151: housing, 2152: refrigerator door, 2153: freezer door, 2170: motor vehicle, 2171: car body, 2172: wheel, 2173: dashboard, 2174: light, 7000: electronic component, 7001: lead, 7002: printed board, 7004: circuit board, 7100: semiconductor wafer, 7102: circuit region, 7104: separation region, 7106: separation line, 7110: chip, a1, a2, a3, a4, a5, Q2, QB2, SN1, SN2, SN3, SN5, and SN6: node, CS1, CS2, CS3, CS5, and CS6: capacitor, MR1, MR2, MR3, MR4, MR5, MR6, MR7, MW1, MW2, MW3, MW5, MW6, T60, T61, T62, T65, T66, T67, T68, and T69: transistor, BL, BGL, GRBL, GWBL, RBL, RWL, RCL, SL, WBL, and WWL: wiring.

This application is based on Japanese Patent Application serial no. 2016-016658 filed with Japan Patent Office on Jan. 29, 2016, and Japanese Patent Application serial no. 2016-016660 filed with Japan Patent Office on Jan. 29, 2016, the entire contents of which are hereby incorporated by reference.

The invention claimed is:

1. A semiconductor device comprising:
a microcontroller unit comprising:
  a clock generator configured to generate a first clock signal and a second clock signal;
  a memory section comprising a memory cell comprising a transistor with an oxide semiconductor in a channel formation region, the memory section configured to generate a wait signal; and
  a processor core configured to delay access to the memory section on the basis of the wait signal,
wherein a write cycle time of the memory cell is longer than a read cycle time of the memory cell, and
wherein a first write cycle time of the memory cell when the microcontroller unit is operated by the first clock signal is longer than a second write cycle time of the memory cell when the microcontroller unit is operated by the second clock signal.

2. A semiconductor device comprising:
a microcontroller unit comprising:
  a clock generator configured to generate a first clock signal and a second clock signal;
  a memory section comprising a memory cell, the memory section configured to generate a wait signal; and
  a processor core configured to delay access to the memory section on the basis of the wait signal,
wherein the memory section comprises at least one of an SRAM, a flash memory, an ferroelectric RAM, a magnetoresistive RAM, a resistance RAM, and a phase change RAM,
wherein a write cycle time of the memory cell is longer than a read cycle time of the memory cell, and
wherein a first write cycle time of the memory cell when the microcontroller unit is operated by the first clock signal is longer than a second write cycle time of the memory cell when the microcontroller unit is operated by the second clock signal.

3. A semiconductor device comprising:
a microcontroller unit comprising:
  a clock generator configured to generate a first clock signal and a second clock signal; and
  a memory section comprising a memory cell,
wherein frequencies of the first clock signal and the second clock signal are different from each other, and
wherein a first write cycle time of the memory cell when the microcontroller unit is operated by the first clock signal is longer than a second write cycle time of the memory cell when the microcontroller unit is operated by the second clock signal.

4. The semiconductor device according to claim 3,
wherein the microcontroller unit comprises a processor core,
wherein the memory section is configured to generate a wait signal, and
wherein the processor core is configured to delay access to the memory section on the basis of the wait signal.

5. The semiconductor device according to claim 3, wherein the first write cycle time of the memory cell is longer than a read cycle time of the memory cell.

6. The semiconductor device according to claim 3,
wherein the memory cell comprises a transistor, and
wherein a channel formation region of the transistor comprises an oxide semiconductor.

7. The semiconductor device according to claim 3, wherein the memory section comprises at least one of an SRAM, a flash memory, an ferroelectric RAM, a magnetoresistive RAM, a resistance RAM, and a phase change RAM.

* * * * *